(12) United States Patent
Swamy

(10) Patent No.: US 10,873,319 B2
(45) Date of Patent: Dec. 22, 2020

(54) COMPENSATION STRUCTURES FOR RADIO FREQUENCY FILTERING DEVICES

(71) Applicant: Qorvo US, Inc., Greensboro, NC (US)

(72) Inventor: Manjunath Swamy, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/272,139

(22) Filed: Feb. 11, 2019

(65) Prior Publication Data
US 2020/0144982 A1    May 7, 2020

Related U.S. Application Data

(60) Provisional application No. 62/755,791, filed on Nov. 5, 2018.

(51) Int. Cl.
*H03H 9/64*    (2006.01)
*H03H 9/02*    (2006.01)
(Continued)

(52) U.S. Cl.
CPC ...... *H03H 9/6489* (2013.01); *H03H 9/02574* (2013.01); *H03H 9/02661* (2013.01); *H03H 9/02732* (2013.01); *H03H 9/02755* (2013.01); *H03H 9/6483* (2013.01); *H03H 9/725* (2013.01); *H04B 1/0057* (2013.01); *H04B 1/1018* (2013.01)

(58) Field of Classification Search
CPC ........... H03H 9/02661; H03H 9/02574; H03H 9/02732; H03H 9/02755; H03H 9/6489; H03H 9/725; H04B 1/0057; H04B 1/1018
USPC ....................................................... 333/193
See application file for complete search history.

(56) References Cited

U.S. PATENT DOCUMENTS

| | | | |
|---|---|---|---|
| 8,427,258 B2 * | 4/2013 | Tanaka | H03H 9/0038 310/313 D |
| 2013/0113576 A1 * | 5/2013 | Inoue | H03H 9/706 333/133 |

OTHER PUBLICATIONS

Beaudin, Steve, et al., "Shoulder Suppressing Technique for Dual Mode SAW Resonators," IEEE Ultrasonics Symposium, Oct. 1999, pp. 389-393.

(Continued)

*Primary Examiner* — Benny T Lee
*Assistant Examiner* — Hafizur Rahman
(74) *Attorney, Agent, or Firm* — Withrow & Terranova, P.L.L.C.

(57) ABSTRACT

Radio frequency (RF) filtering devices, and particularly compensation structures for RF filtering devices are disclosed. Representative RF filtering devices are described that include compensation structures configured to adjust, reduce, or cancel leakage signals within the RF filtering devices, thereby providing improved isolation. Compensation structures may include surface acoustic wave (SAW) devices having multiple interdigital transducers (IDT) that are longitudinally coupled between two reflective structures. Different IDTs of a SAW device may be electrically connected to an RF filtering device, and at least one IDT of the SAW device may comprise an electrically floating electrode that provides the ability to further tune acoustic waves. Depending on the application, the compensation structure may be electrically connected to different portions of the RF filtering device. In certain embodiments, the RF filtering device is an RF duplexing device.

21 Claims, 17 Drawing Sheets

(51) Int. Cl.
    *H04B 1/00*         (2006.01)
    *H03H 9/72*         (2006.01)
    *H04B 1/10*         (2006.01)

(56) References Cited

OTHER PUBLICATIONS

Inoue, Shogo, "Ultra-Steep Cut-Off Double Mode SAW Filter and Its Application to a PCS Duplexer," IEEE Transactions on Ultrasonics, Ferroelectrics, and Frequency Control, vol. 54, Issue 9, Sep. 2007, pp. 1882-1887.

Iwaki, M., et al., "Recent Study on High-Isolation SAW/BAW Devices," Seventh International Symposium on Acoustic Wave Devices for Future Mobile Communication Systems, Mar. 2018, 5 pages.

Ueda, Masanori, et al., "Low Loss and High Isolation Techniques for High Power RF Acoustic Devices," International Microwave Symposium, May 2016, IEEE, 4 pages.

\* cited by examiner

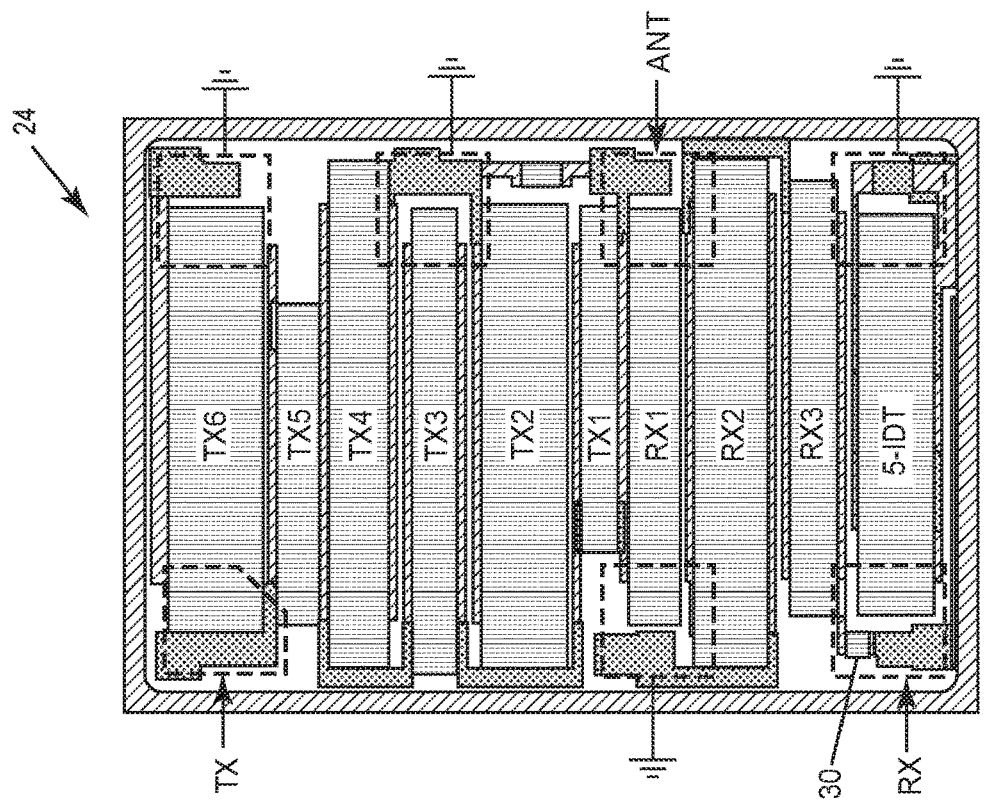
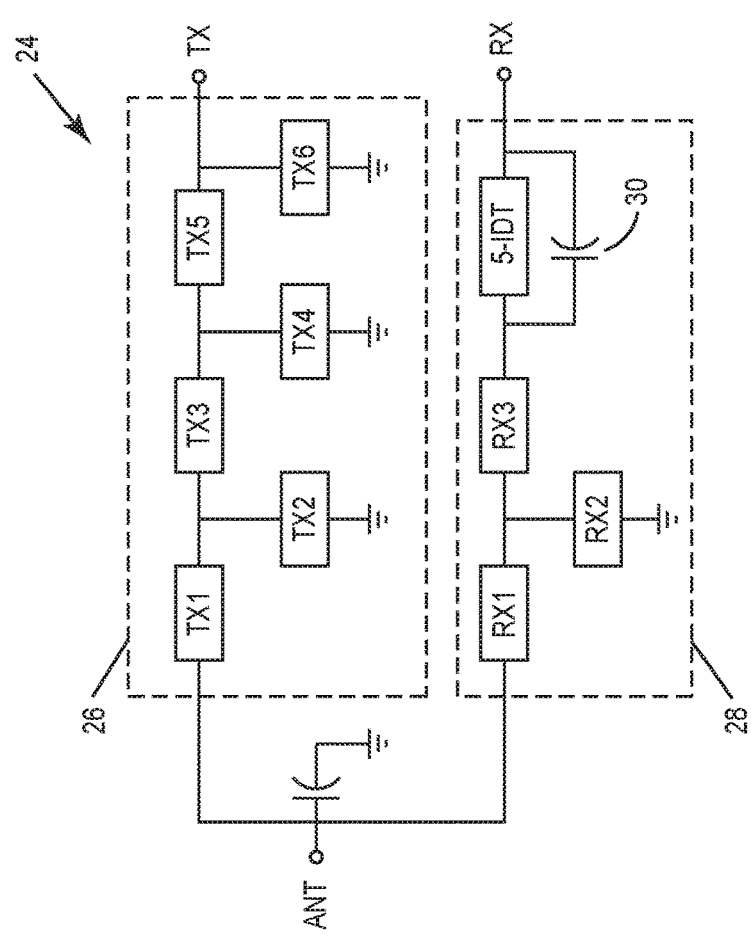
FIG. 2B
FIG. 2A

COMPENSATION STRUCTURES FOR RADIO FREQUENCY FILTERING DEVICES

RELATED APPLICATIONS

This application claims the benefit of provisional patent application Ser. No. 62/755,791, filed Nov. 5, 2018, the disclosure of which is hereby incorporated herein by reference in its entirety.

FIELD OF THE DISCLOSURE

The present disclosure relates to filtering devices, and particularly to compensation structures for radio frequency filtering devices.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions.

Surface acoustic wave (SAW) devices, such as SAW resonators and SAW filters, are used in many applications such as radio frequency (RF) filters. For example, SAW filters are commonly used in second generation (2G), third generation (3G), and fourth generation (4G) wireless receiver front ends, duplexers, and receive filters. The widespread use of SAW filters is due to, at least in part, the fact that SAW filters exhibit low insertion loss with good rejection, can achieve broad bandwidths, and are a small fraction of the size of traditional cavity and ceramic filters. As the use of SAW filters in modern RF communication systems increase, there is a need for RF filtering devices having improved isolation with reduced leakage and loss.

SUMMARY

The present disclosure relates to radio frequency (RF) filtering devices, and particularly to compensation structures for RF filtering devices. Representative RF filtering devices are described herein that include compensation structures configured to adjust, reduce, or cancel a leakage signal within the RF filtering devices, thereby providing improved isolation. In certain embodiments, compensation structures include surface acoustic wave (SAW) devices. The SAW devices may include multiple interdigital transducers (IDT) that are longitudinally coupled between two reflective structures. Different IDTs of the SAW device may be electrically connected to an RF filtering device and at least one IDT of the SAW device may comprise an electrically floating electrode that provides the ability to further tune acoustic waves within the SAW device. Depending on the application, the compensation structure may be electrically connected to different portions of the RF filtering device. In certain embodiments, the RF filtering device is an RF duplexing device.

In one aspect, an RF filtering device comprises: a plurality of series resonators and a plurality of shunt resonators electrically connected along a signal line between a first port and a second port; and a compensation structure arranged in parallel with one or more series resonators of the plurality of series resonators, the compensation structure comprising: a surface acoustic wave (SAW) device comprising: a piezoelectric material; and a plurality of interdigital transducers (IDTs) on the piezoelectric material that are longitudinally coupled between two reflective structures, wherein a first IDT and a last IDT of the plurality of IDTs are electrically connected to different portions of the signal line, and at least one additional IDT of the plurality of IDTs is arranged between the first IDT and the last IDT, the at least one additional IDT comprising an electrically floating electrode. The at least one additional IDT may further comprise an electrode that is electrically connected to ground. In certain embodiments, the at least one additional IDT comprises two additional IDTs and each of the two additional IDTs comprises an electrically floating electrode and an electrode that is electrically connected to ground. In certain embodiments, the at least one additional IDT further comprises an electrode that is electrically connected to ground and at least one other additional IDT of the plurality of IDTs comprises an electrode that is electrically connected to the signal line. The at least one other additional IDT of the plurality of IDTs and the first IDT of the plurality of IDTs may be electrically connected to the same portion of the signal line. In other embodiments, the at least one other additional IDT of the plurality of IDTs is electrically connected to a different portion of the signal line than the first IDT. In certain embodiments, the first port comprises a transmitter (TX) port, the second port comprises a receiver (RX) port, and the RF filtering device further comprises an antenna (ANT) port. In certain embodiments, the plurality of series resonators comprises a plurality of TX series resonators arranged between the TX port and the ANT port and a plurality of RX series resonators arranged between the RX port and the ANT port. In certain embodiments, the first IDT is electrically connected between the TX port and the plurality of TX series resonators and the last IDT is electrically connected between the RX port and the plurality of RX series resonators. In certain embodiments, a SAW filtering device is serially connected between the RX port and the plurality of RX series resonators, wherein the last IDT is electrically connected between the SAW filtering device and the plurality of RX series resonators. In certain embodiments, the first IDT comprises a first electrode that is electrically connected to the signal line and a second electrode that comprises an electrically floating electrode.

In another aspect, an RF duplexing device comprises: a TX port, a RX port, and an ANT port; a TX filter connected between the TX port and the ANT port; an RX filter connected between the RX port and the ANT port; and a compensation structure electrically connected to a signal line between the RX port and the TX port, the compensation structure comprising: a piezoelectric material; and a plurality of IDTs on the piezoelectric material that are longitudinally coupled between two reflective structures to form a SAW device, wherein a first IDT and a last IDT of the plurality of IDTs are electrically connected to different portions of the signal line, and at least one additional IDT of the plurality of IDTs is arranged between the first IDT and the last IDT, the at least one additional IDT comprising an electrically floating electrode. In certain embodiments, the TX filter comprises a plurality of TX series resonators and the first IDT is electrically connected to the signal line between the plurality of TX series resonators and the TX port. In certain embodiments, the last IDT is electrically connected between the plurality of TX series resonators and the ANT port. In certain embodiments, the RX filter comprises a plurality of RX series resonators and the last IDT is electrically connected between the plurality of RX series resonators and the RX port. In certain embodiments, each of the first IDT, the at least one additional IDT, and the last IDT are electrically connected to a different portion of the signal line. In certain embodiments, the TX filter comprises a plurality of TX series resonators and first IDT is electrically connected between two adjacent TX series resonators of the plurality of TX series resonators. In certain embodiments, the last IDT is electrically connected between the plurality of TX series resonators and the ANT port. In certain embodiments, the first IDT is electrically connected between the RX filter and the ANT port and the last IDT is electrically connected between the RX filter and the RX port. In certain embodiments, the first IDT comprises a first electrode that is electrically connected to the signal line and a second electrode that comprises an electrically floating electrode.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2A illustrates a block diagram of a representative radio frequency (RF) duplexer device as disclosed herein.

FIG. 2B is a top view of a device layout of the RF duplexer of FIG. 2A.

DETAILED DESCRIPTION

Figure 1:
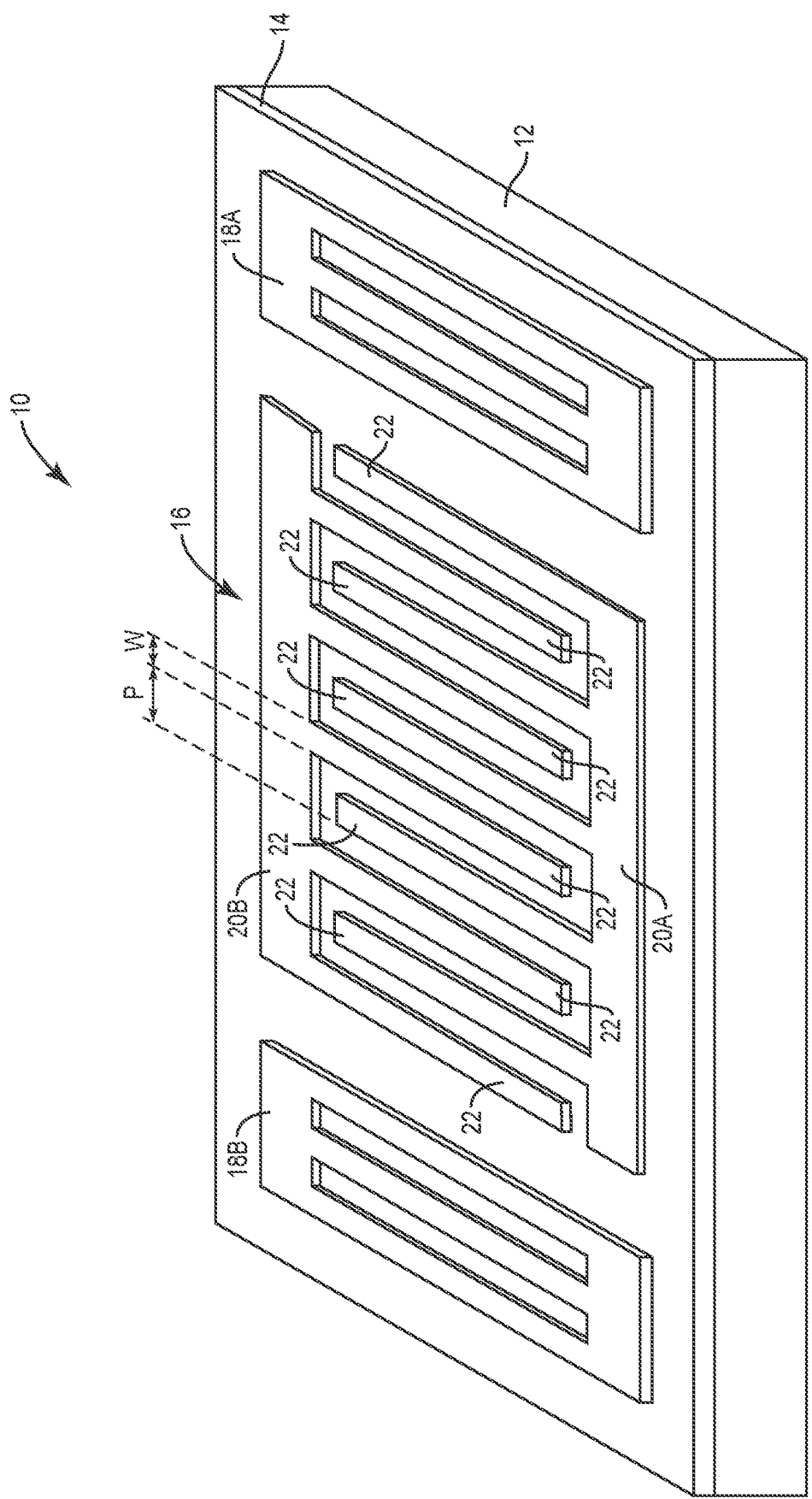
FIG. 1 is a perspective view illustration of a representative surface acoustic wave (SAW) device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to radio frequency (RF) filtering devices, and particularly to compensation structures for RF filtering devices. Representative RF filtering devices are described herein that include compensation structures configured to adjust, reduce, or cancel a leakage signal within the RF filtering device, thereby providing improved isolation. In certain embodiments, compensation structures include surface acoustic wave (SAW) devices. The SAW devices may include multiple interdigital transducers (IDT) that are longitudinally coupled between two reflective structures. Different IDTs of the SAW device may be electrically connected to the RF filtering device and at least one IDT of the SAW device may comprise an electrically floating electrode that provides the ability to further tune acoustic waves within the SAW device. Depending on the application, the compensation structure may be electrically connected to different portions of the RF filtering device. In certain embodiments, the RF filtering device is an RF duplexing device.

Before describing particular embodiments of the present disclosure further, a general discussion of SAW devices is provided. FIG. 1 is a perspective view illustration of a representative SAW device 10. The SAW device 10 includes a substrate 12, a piezoelectric layer 14 on the substrate 12, an IDT 16 on a surface of the piezoelectric layer 14 opposite the substrate 12, a first reflector structure 18A on the surface of the piezoelectric layer 14 adjacent to the IDT 16, and a second reflector structure 18B on the surface of the piezoelectric layer 14 adjacent to the IDT 16 opposite the first reflector structure 18A.

The IDT 16 includes a first electrode 20A and a second electrode 20B, each of which include a number of electrode fingers 22 that are interleaved with one another as shown. The first electrode 20A and the second electrode 20B may also be referred to as comb electrodes. A lateral distance between adjacent electrode fingers 22 of the first electrode 20A and the second electrode 20B defines an electrode pitch P of the IDT 16. The electrode pitch P may at least partially define a center frequency wavelength A of the SAW device 10, where the center frequency is the primary frequency of mechanical waves generated in the piezoelectric layer 14 by the IDT 16. For a single electrode IDT 16 such as the one shown in FIG. 1, the center frequency wavelength A is equal to twice the electrode pitch P. For a double electrode IDT 16, the center frequency wavelength A is equal to four times the electrode pitch P. A finger width W of the adjacent electrode fingers 22 over the electrode pitch P may define a metallization ratio, or duty factor, of the IDT 16, which may dictate certain operating characteristics of the SAW device 10.

In operation, an alternating electrical input signal provided at the first electrode 20A is transduced into a mechanical signal in the piezoelectric layer 14, resulting in one or more acoustic waves therein. In the case of the SAW device 10, the resulting acoustic waves are predominately surface acoustic waves. As discussed above, due to the electrode pitch P and the metallization ratio of the IDT 16, the characteristics of the material of the piezoelectric layer 14, and other factors, the magnitude and frequency of the acoustic waves transduced in the piezoelectric layer 14 are dependent on the frequency of the alternating electrical input signal. This frequency dependence is often described in terms of changes in the impedance and/or a phase shift between the first electrode 20A and the second electrode 20B with respect to the frequency of the alternating electrical input signal. An alternating electrical potential between the two electrodes 20A and 20B creates an electrical field in the piezoelectric material which generate acoustic waves. The acoustic waves travel at the surface and eventually are transferred back into an electrical signal between the electrodes 20A and 20B. The first reflector structure 18A and the second reflector structure 18B reflect the acoustic waves in the piezoelectric layer 14 back towards the IDT 16 to confine the acoustic waves in the area surrounding the IDT 16.

The substrate 12 may comprise various materials including glass, sapphire, quartz, silicon (Si), or gallium arsenide (GaAs) among others, with Si being a common choice. The piezoelectric layer 14 may be formed of any suitable piezoelectric material(s). In certain embodiments described herein, the piezoelectric layer 14 is formed of lithium tantalate (LT), or lithium niobate ($LiNbO_3$), but is not limited thereto. In certain embodiments, the piezoelectric layer 14 is thick enough or rigid enough to function as a piezoelectric substrate. Accordingly, the substrate 12 in FIG. 1 may be omitted. Those skilled in the art will appreciate that the principles of the present disclosure may apply to other materials for the substrate 12 and the piezoelectric layer 14. The IDT 16, the first reflector structure 18A, and the second reflector structure 18B may comprise aluminum (Al). While not shown to avoid obscuring the drawings, additional passivation layers, frequency trimming layers, or any other layers may be provided over all or a portion of the exposed surface of the piezoelectric layer 14, the IDT 16, the first reflector structure 18A, and the second reflector structure 18B. Further, one or more layers may be provided between the substrate 12 and the piezoelectric layer 14 in various embodiments.

SAW devices according to embodiments disclosed herein may be incorporated within larger filtering devices and systems to provide simplified layouts or topologies. FIG. 2A illustrates a representative RF duplexing device as disclosed herein. RF duplexing devices typically are configured to receive signals and transmit signals of a different band using a common antenna. One of the primary challenges of duplexing is that RF transmission signals and RF receive signals can interfere with one another and accordingly, RF duplexing devices may employ one or more filters to improve isolation.

FIG. 2A is a block diagram of a representative RF duplexer 24. The RF duplexer 24 includes a transmit or transmitter (TX) port, a receive or receiver (RX) port, and an antenna (ANT) port. A TX filter 26 is positioned between the TX port and the ANT port and an RX filter 28 is positioned between the RX port and the ANT port. The TX filter 26 is configured as a ladder filter with series resonators TX1, TX3, TX5 and shunt resonators TX2, TX4, TX6. The RX filter 28 includes series resonators RX1, RX3, and a shunt resonator RX2 as well as a 5-IDT SAW device between the ANT port and the RX port. In certain embodiments, the 5-IDT SAW device is a filtering device that is serially connected between the RX port and the series resonators RX1, RX3. In certain embodiments, the 5-IDT SAW device may include five IDTs, such as alternating input IDTs and output IDTs, which are longitudinally coupled between two reflective structures or gratings to form a coupled resonator filter (CRF). Additionally, a capacitor 30 may be connected between the input and output of the 5-IDT SAW device. In operation, the RF duplexer 24 is configured for operation in the Long Term Evolution (LTE) frequency band 14. FIG. 2B is a top view of a device layout of the RF duplexer 24 of FIG. 2A. As illustrated, the resonators TX1 to TX6, the resonators RX1 to RX3, the 5-IDT SAW device are arranged sequentially across the RF duplexer 24 with areas for RX, TX, antenna, and various ground connections. In certain applications, it is desirable for the RF duplexer 24 to be sized as small as possible. In such arrangements, the resonators TX1 to TX6, the resonators RX1 to RX3, and the 5-IDT SAW device are positioned in close proximity to one another in a single chip or device format. Accordingly, unwanted parasitic capacitance may be unavoidable and in operation, signal leakage may occur between the TX portions and RX portions of the RF duplexer 24. The signal leakage may occur directly through the signal lines connecting the RX port, the TX port, and the ANT port or indirectly through other components of the RF duplexer 24, such as package housing or mounting boards.

Figure 3A:
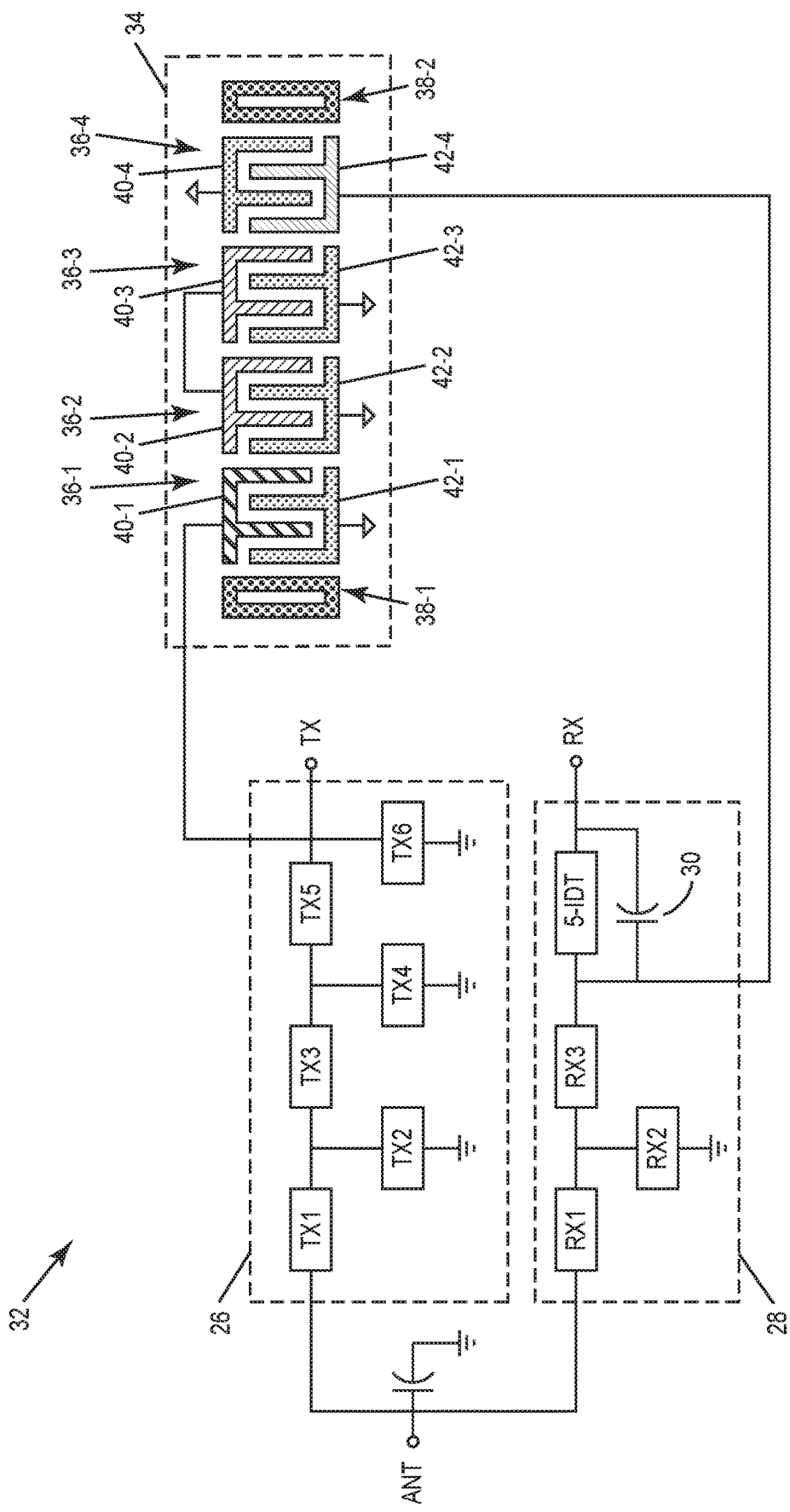
FIG. 3A is block diagram of an RF duplexer that includes a compensation structure for improving isolation between a transmit (TX) filter and a receive (RX) filter according to embodiments disclosed herein.

FIG. 3A is block diagram of an RF duplexer 32 that includes a compensation structure 34 for improving isolation between the TX filter 26 and the RX filter 28 according to embodiments disclosed herein. The TX filter 26 and the RX filter 28 may be configured as previously described. As illustrated in FIG. 3A, the compensation structure 34 is configured with connections between the TX port and the RX port and is thereby arranged in parallel with the signal lines connecting the TX port and the RX port. In this regard, the compensation structure 34 may be configured to adjust or filter the phase and magnitude of a leakage signal between the TX port and the RX port, thereby providing improved isolation for the RF duplexer 32. In particular, the compensation structure 34 may adjust the amplitude and phase of the leakage signal through the compensation structure 34 in order to reduce or cancel out the leakage signal between the TX port and the RX port. In certain embodiments, the compensation structure 34 may comprise a SAW CRF structure that includes a plurality of IDTs 36-1 to 36-4 that are longitudinally coupled between two reflective structures 38-1, 38-2. Each of the plurality of IDTs 36-1 to 36-4 comprises an electrode pair that includes a corresponding first electrode 40-1 to 40-4 and a corresponding second electrode 42-1 to 42-4. As illustrated, the first electrode 40-1 of the first IDT 36-1 is electrically connected between the last series resonator TX5 of the TX filter 26 and the TX port, and the second electrode 42-1 of the first IDT 36-1 is electrically connected to ground. Additionally, the second electrode 42-4 of the last IDT 36-4 is electrically connected between the last series resonator RX3 of the RX filter 28 and the 5-IDT SAW device, and the first electrode 40-4 of the last IDT 36-4 is electrically connected to ground. In this regard, the compensation structure 34 is electrically connected in parallel with the series resonators TX1, TX3, TX5 and the series resonators RX1, RX3 between the TX port and the RX port. The additional IDTs 36-2 and 36-3 are longitudinally coupled between the IDT 36-1 and the IDT 36-4. The first electrode 40-2, 40-3 of each of the additional IDTs 36-2, 36-3 comprises an electrically floating electrode while the second electrode 42-2, 42-3 of each of the additional IDTs 36-2, 36-3 is electrically connected to ground. Additionally, the first electrodes 40-2, 40-3 that are electrically floating may be connected to one another. In operation, acoustic waves coupled between the first and last IDTs 36-1, 36-4 may be further altered or adjusted by the additional IDTs 36-2, 36-3. The additional IDTs 36-2, 36-3 thereby provide the freedom to alter the acoustic coupling between the first and last IDTs 36-1, 36-4 with reduced sensitivity. By way of example, the RF duplexer 32 is configured for operation in the LTE frequency band 14, although the embodiments disclosed herein are equally applicable to other LTE frequency bands.

Figure 3B:
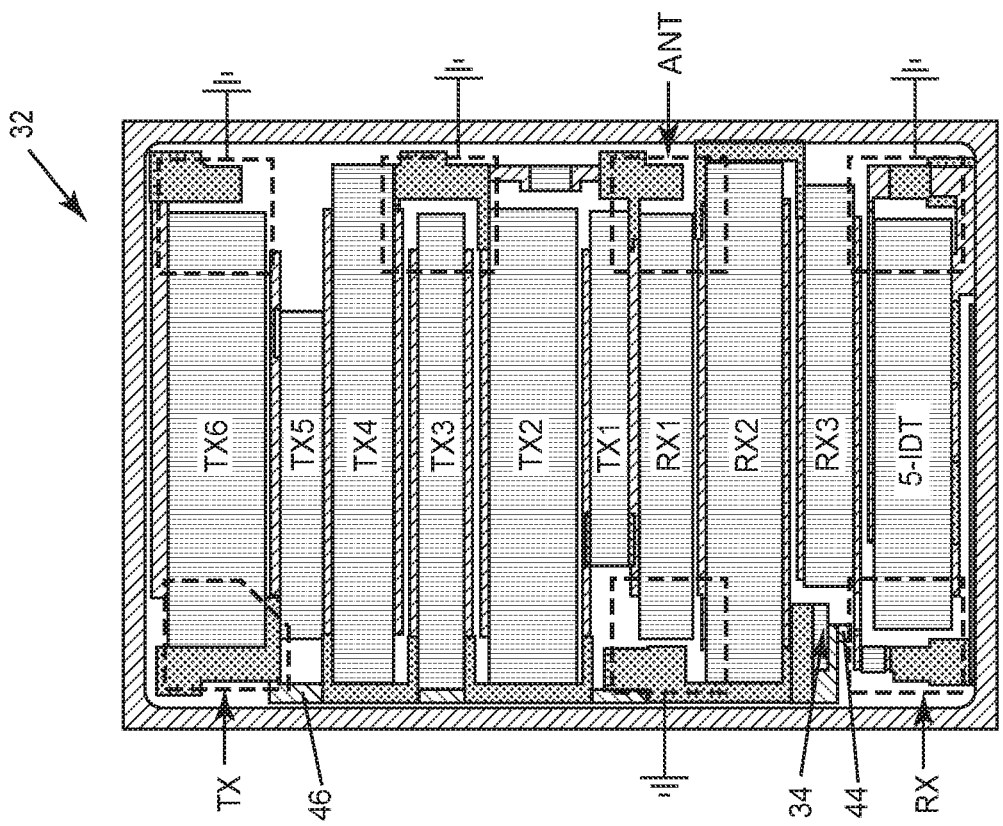
FIG. 3B is a top view of a device layout of the RF duplexer of FIG. 3A.

FIG. 3B is a top view of a device layout of the RF duplexer 32 of FIG. 3A. As illustrated, the resonators TX1 to TX6, the resonators RX1 to RX3, the 5-IDT SAW device are arranged sequentially across the RF duplexer 32 with areas for RX, TX, antenna, and various ground connections in a similar manner to the RF duplexer 24 of FIG. 2B. In FIG. 3B, the compensation structure 34 occupies a relatively small area between the RX port and the resonator RX3 and is electrically connected to the RX port by way of an electrical connection 44 and to the TX port by way of an electrical connection 46. In this regard, the compensation structure 34 may be incorporated within the same chip as the rest of the RF duplexer 32, thereby providing improved isolation without having a substantial impact on the overall size of the RF duplexer 32.

Figure 3C:
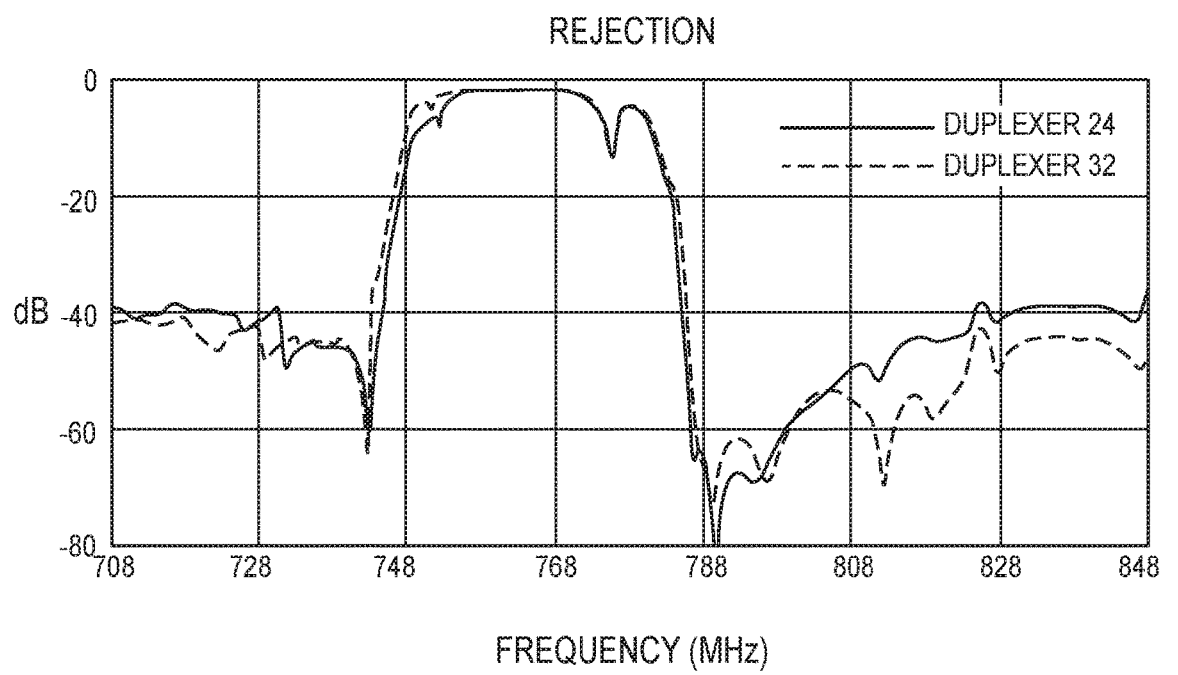
FIG. 3C is a comparison plot for rejection performance simulations of the RF duplexer of FIG. 2A and the RF duplexer of FIG. 3A.

FIG. 3C is a comparison plot for rejection performance simulations of the RF duplexer 24 of FIG. 2A and the RF duplexer 32 of FIG. 3A. The rejection performance is plotted in decibels (dB) across a megahertz (MHz) frequency range. A passband is illustrated where the plot values are close to 0 dB with shoulder regions on either side where the plot values noticeably decrease from 0 dB. It is desirable to have a passband with sharp or steep shoulders that transition to high rejection performance on either side of the passband. As illustrated, the RF duplexer 32 shows a steep shoulder on the high frequency side of the passband and has noticeably improved rejection for various regions above and below the passband. In particular, the simulation results indicate the RF duplexer 32 has noticeable rejection improvement for frequencies in the range of about 818 MHz to about 827 MHz.

Figure 3D:
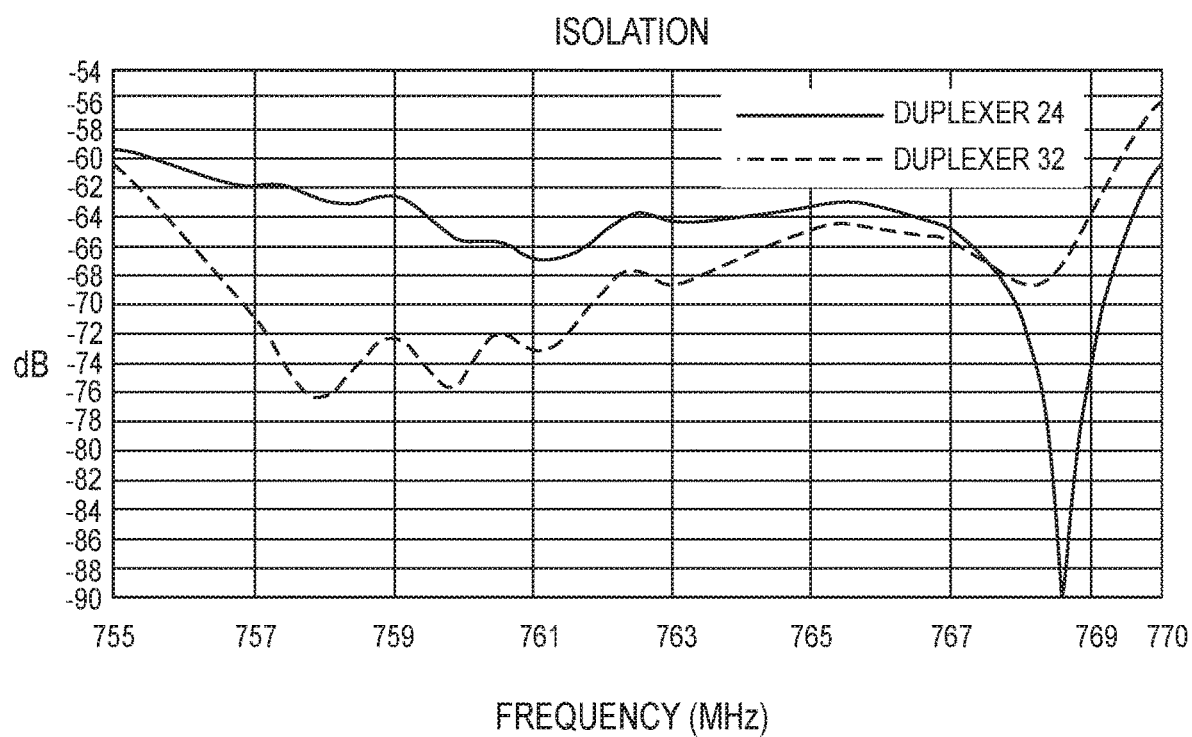
FIG. 3D is a comparison plot for isolation performance simulations of the RF duplexer of FIG. 2A and the RF duplexer of FIG. 3A.

FIG. 3D is a comparison plot for isolation performance simulations of the RF duplexer 24 of FIG. 2A and the RF duplexer 32 of FIG. 3A. The isolation performance is plotted in dB across a MHz frequency range and a lower value indicates better isolation. As illustrated, the simulation results indicate the RF duplexer 32 has noticeable isolation improvement for various frequencies. In particular, the simulation results show the RF duplexer 32 has an isolation improvement of about 13 dB compared to the RF duplexer 24 at a frequency of 758 MHz, and the RF duplexer 32 shows an overall isolation improvement compared to the RF duplexer 24 across a frequency range from about 758 MHz to about 768 MHz.

Figure 4A:
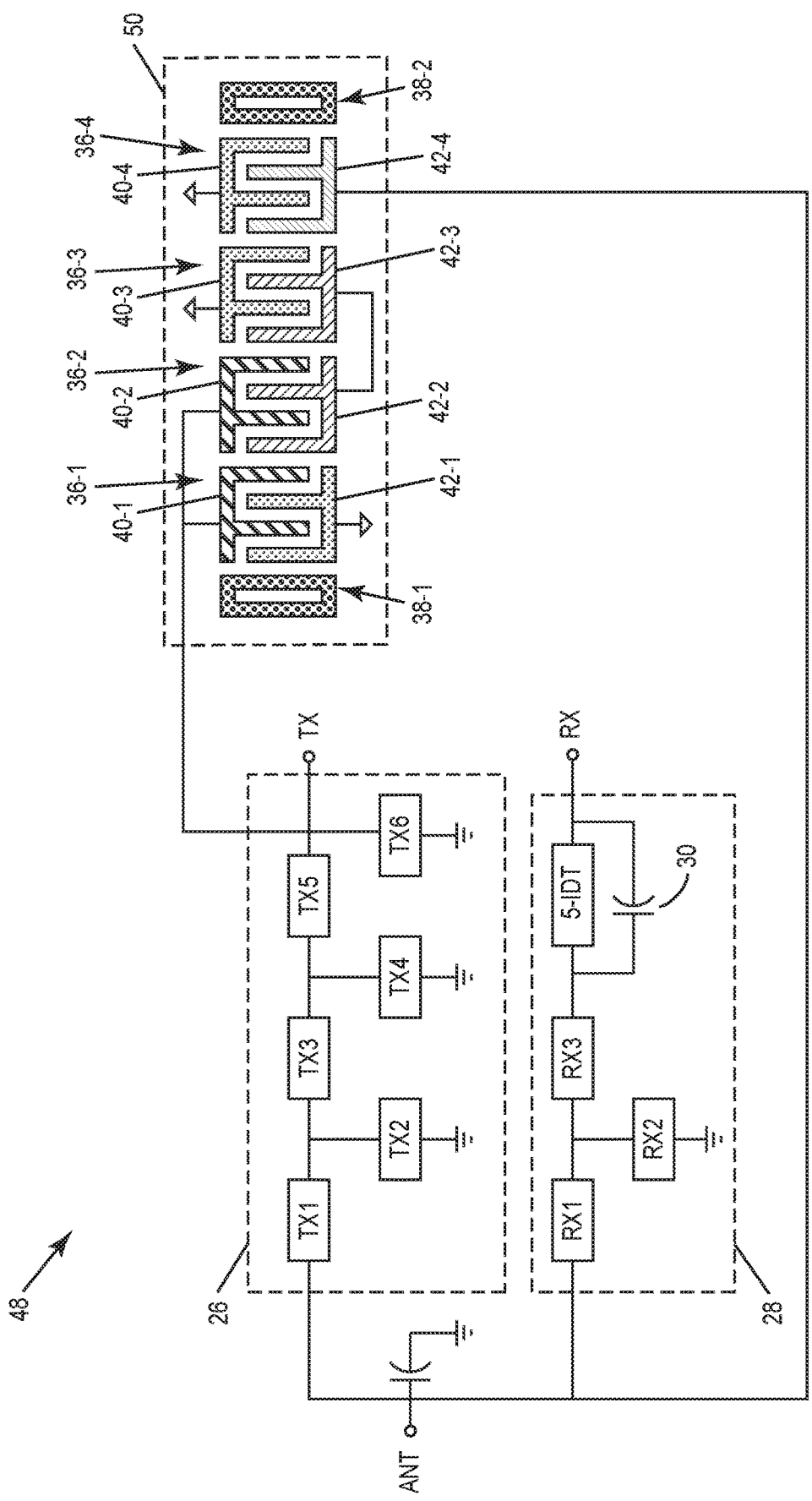
FIG. 4A is block diagram of a different RF duplexer that includes a compensation structure for improving isolation between the TX filter and the RX filter according to embodiments disclosed herein.

FIG. 4A is block diagram of an RF duplexer 48 that includes a compensation structure 50 for improving isolation between the TX filter 26 and the RX filter 28 according to embodiments disclosed herein. The TX filter 26 and the RX filter 28 may be configured as previously described. As illustrated in FIG. 4A, the compensation structure 50 is configured with connections between the TX port and the ANT port and is thereby arranged in parallel with the signal lines connecting the TX port and the ANT port. In this regard, the compensation structure 50 may be configured to adjust or filter the phase and magnitude of a leakage signal between the TX port and the ANT port, thereby providing improved isolation for the TX filter 26 of the RF duplexer 48. In particular, the compensation structure 50 may adjust the amplitude and phase of the leakage signal through the compensation structure 50 in order to reduce or cancel out the leakage signal between the TX port and the ANT port. As with previous embodiments, the compensation structure 50 may comprise a SAW CRF structure that includes the plurality of IDTs 36-1 to 36-4 that are longitudinally coupled between the two reflective structures 38-1, 38-2. Each of the plurality of IDTs 36-1 to 36-4 comprises an electrode pair that includes the corresponding first electrode 40-1 to 40-4 and the corresponding second electrode 42-1 to 42-4. As illustrated, the first electrode 40-1 of the first IDT 36-1 is electrically connected between the last series resonator TX5 of the TX filter 26 and the TX port, and the second electrode 42-1 of the first IDT 36-1 is electrically connected to ground. Additionally, the second electrode 42-4 of the last IDT 36-4 is electrically connected between the first series resonator TX1 of the TX filter 26 and the ANT port, and the first electrode 40-4 of the last IDT 36-4 is electrically connected to ground. In this regard, the compensation structure 50 is electrically connected in parallel with the TX filter 26 between the TX port and the ANT port. The additional IDTs 36-2 and 36-3 are longitudinally coupled between the IDT 36-1 and the IDT 36-4. Notably, the first electrode 40-2 of the additional IDT 36-2 is also electrically connected between the last series resonator TX5 of the TX filter 26 and the TX port, and the second electrode 42-2 of the additional IDT 36-2 is an electrically floating electrode. The first electrode 40-3 of the other additional IDT 36-3 is electrically connected to ground, and the second electrode 42-3 of the other additional IDT 36-3 is an electrically floating electrode. Additionally, the second electrodes 42-2, 42-3 that are electrically floating may be connected to one another. In this regard, both of the first IDT 36-1 and the additional IDT 36-2 are electrically connected between the resonator TX5 and the TX port such that same signal connection is made to two different electrodes 40-1, 40-2 of the SAW CRF of the compensation structure 50. In operation, acoustic waves coupled between the first and last IDTs 36-1, 36-4 may be further altered or adjusted by the additional IDTs 36-2, 36-3, thereby providing improved isolation in the TX filter 26. The additional IDTs 36-2, 36-3 provide the freedom to alter the acoustic coupling between the first and last IDTs 36-1, 36-4 with reduced sensitivity. By way of example, the RF duplexer 48 is configured for operation in the LTE frequency band 14, although the embodiments disclosed herein are equally applicable to other LTE frequency bands.

Figure 4B:
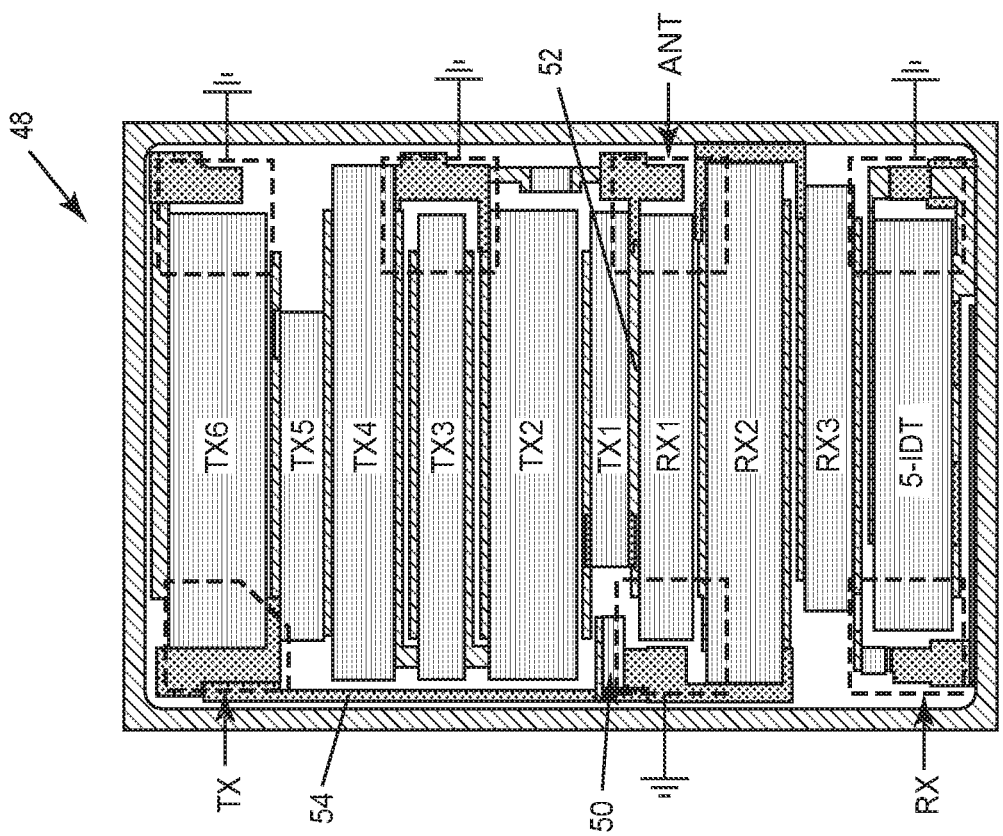
FIG. 4B is a top view of a device layout of the RF duplexer of FIG. 4A.

FIG. 4B is a top view of a device layout of the RF duplexer 48 of FIG. 4A. As illustrated, the resonators TX1 to TX6, the resonators RX1 to RX3, and the 5-IDT SAW device are arranged sequentially across the RF duplexer 48 with areas for RX, TX, antenna, and various ground connections in a similar manner to the RF duplexer 32 of FIG. 3B. In FIG. 4B, the compensation structure 50 occupies a relatively small area next to the resonator TX1 and is electrically connected to the ANT port by way of an electrical connection 52 and to the TX port by way of electrical connection 54. In this regard, the compensation structure 50 may be incorporated within the same chip as the rest of the RF duplexer 48, thereby providing improved isolation without having a substantial impact on the overall size of the RF duplexer 48.

Figure 4C:
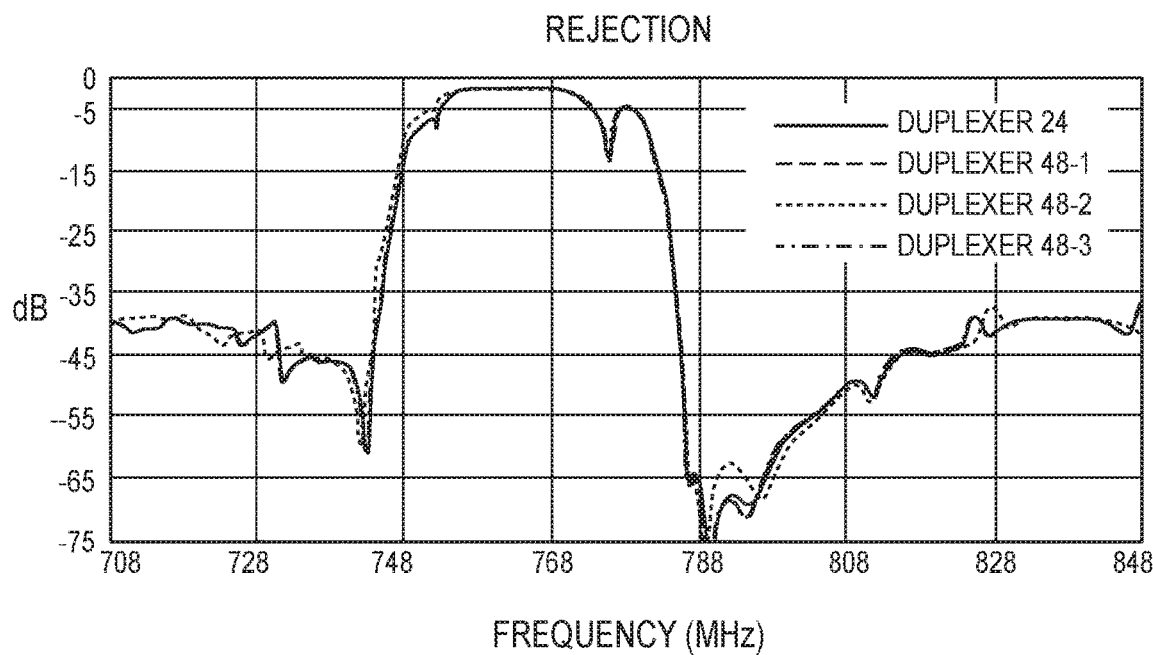
FIG. 4C is a comparison plot for rejection performance simulations of the RF duplexer of FIG. 2A and various configurations of the RF duplexer of FIG. 4A.

FIG. 4C is a comparison plot for rejection performance simulations of the RF duplexer 24 of FIG. 2A and various configurations of the RF duplexer 48 of FIG. 4A. In FIG. 4C, three different RF duplexer configurations 48-1, 48-2, 48-3 of the RF duplexer 48 are simulated. For the first configuration 48-1, the following dimensions were simulated: aperture=6λ, aperture frequency=765 MHz, length=1.5λ and frequency=765 MHz for both reflective structures (38-1, 38-2 of FIG. 4A), length=4.5λ and frequency=765 MHz for the first and last IDTs (36-1, 36-4 of FIG. 4A), and length=3.5λ and frequency=758 MHz for the additional IDTs (36-2, 36-3 of FIG. 4A). For the second configuration 48-2, the following dimensions were simulated: aperture=6λ, aperture frequency=700 MHz, length=1.5λ and frequency=756 MHz for both reflective structures (38-1, 38-2 of FIG. 4A), length=3.5λ and frequency=785 MHz for the first and last IDTs (36-1, 36-4 of FIG. 4A), and length=3λ and frequency=756 MHz for the additional IDTs (36-2, 36-3 of FIG. 4A). For the third configuration 48-3, the following dimensions were simulated: aperture=7λ, aperture frequency=950 MHz, length=1.5λ and frequency=755 MHz for both reflective structures (38-1, 38-2 of FIG. 4A), length=4.5λ and frequency=755 MHz for the first and last IDTs (36-1, 36-4 of FIG. 4A), and length=3λ and frequency=786 MHz for the additional IDTs (36-2, 36-3 of FIG. 4A). The rejection performance is plotted in dB across a MHz frequency range. A passband is illustrated where the plot values are close to 0 dB with shoulder regions on either side where the plot values noticeably decrease from 0 dB. It is desirable to have a passband with sharp or steep shoulders that transition to high rejection performance on either side of the passband. As illustrated, all of the RF duplexer 48-1, 48-2, 48-3 configurations show a steep shoulder on the high frequency side of the passband in a similar manner to the RF duplexer 24. In the plot of FIG. 4C, the rejection performance of the RF duplexer configurations 48-1, 48-3 substantially overlap with the RF duplexer 24 such that the plot lines for the RF duplexer configuration 48-1, and in particular for the RF duplexer configuration 48-3, are hidden behind the RF duplexer 24 plot line.

Figure 4D:
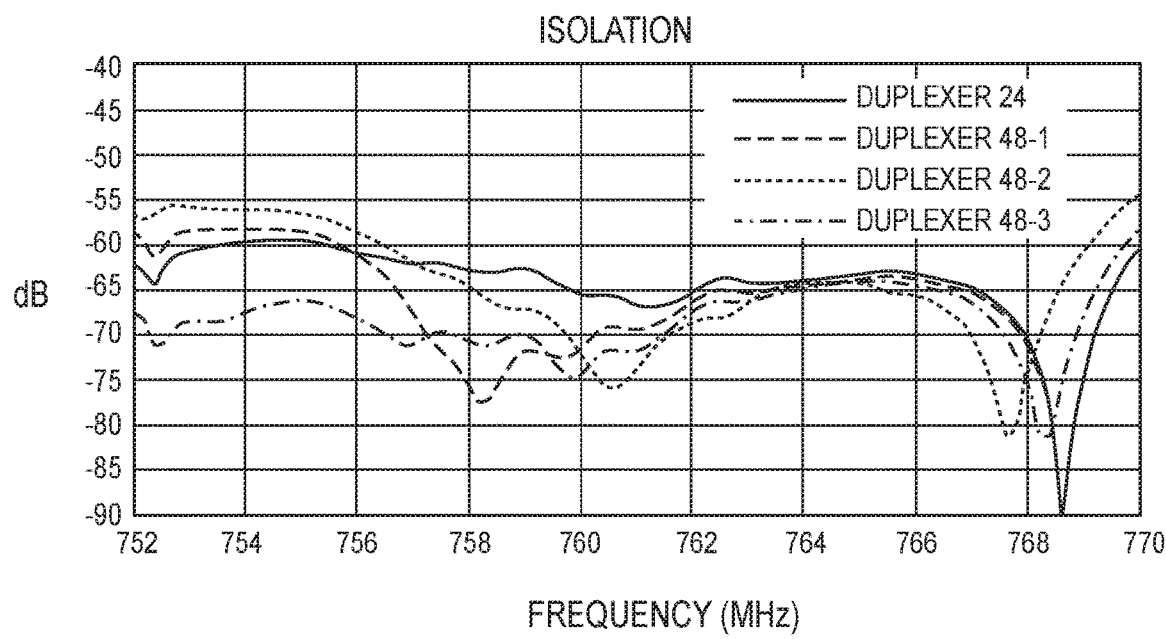
FIG. 4D is a comparison plot for isolation performance simulations of the RF duplexer of FIG. 2A and various configurations of the RF duplexer of FIG. 4A.

FIG. 4D is a comparison plot for isolation performance simulations of the RF duplexer 24 of FIG. 2A and the RF duplexer configurations 48-1, 48-2, 48-3 described for FIG.

4A and FIG. 4C. The isolation performance is plotted in dB across a MHz frequency range and a lower value indicates better isolation. As illustrated, the simulation results indicate the RF duplexer configurations 48-1, 48-2, 48-3 have noticeable isolation improvement for various frequencies. In particular, the simulation results show the RF duplexer configuration 48-1 has the highest isolation improvement at a frequency of 758 MHz and the RF duplexer configuration 48-2 has the highest isolation improvement at a frequency of 767 MHz. Finally, the RF duplexer configuration 48-3 shows an overall isolation improvement compared to the RF duplexer 24 across a frequency range from about 758 MHz to about 768 MHz.

Figure 5A:
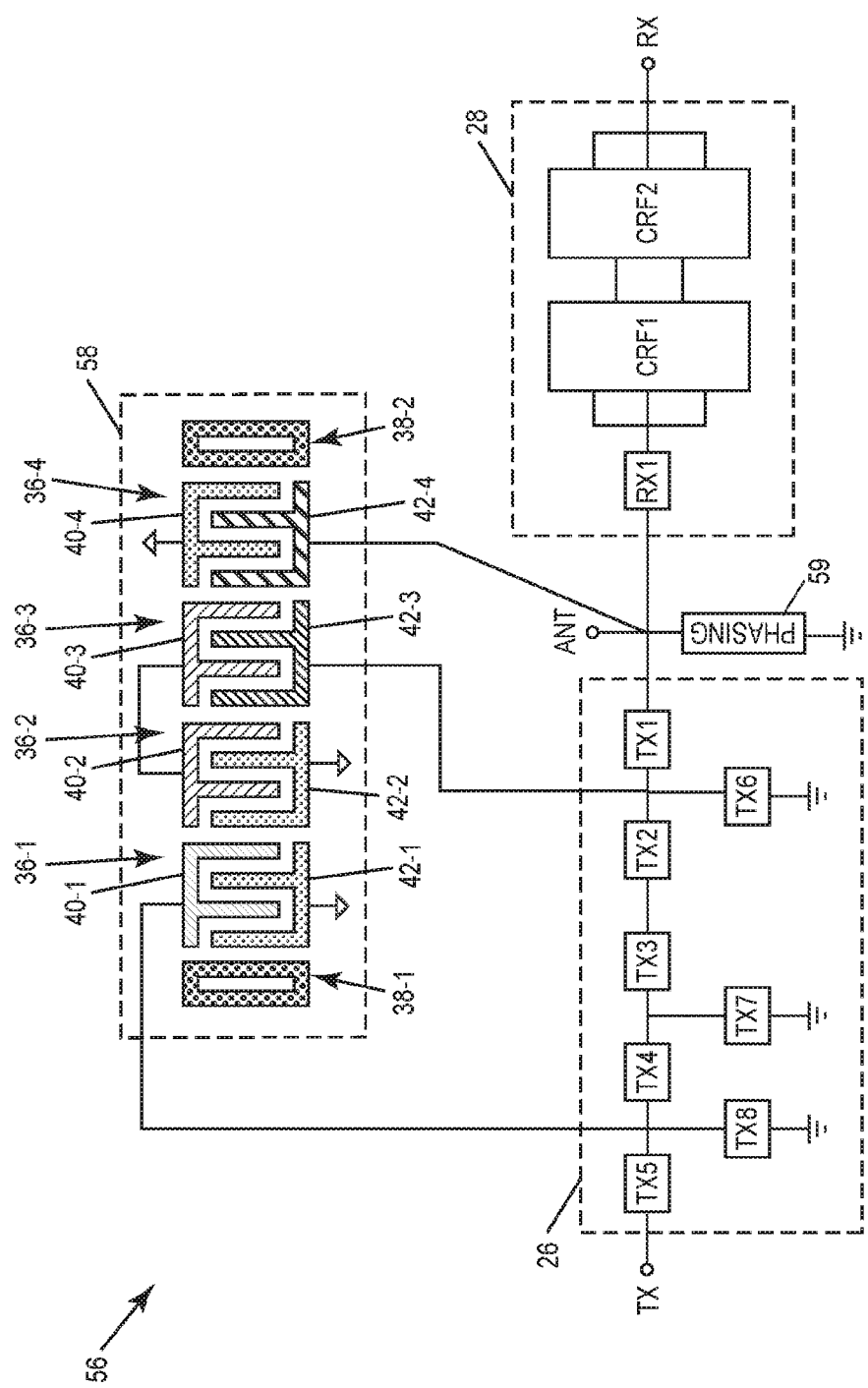
FIG. 5A is block diagram of a different RF duplexer that includes a compensation structure for improving isolation between the TX filter and the RX filter according to embodiments disclosed herein.

By way of examples, the previous embodiments were described for LTE frequency band 14 configurations, although the embodiments disclosed herein are equally applicable to other LTE frequency bands. In that regard, FIG. 5A is block diagram of an RF duplexer 56 configured for the LTE frequency band 12 that includes a compensation structure 58 for improving isolation between the TX filter 26 and the RX filter 28 according to embodiments disclosed herein. For the LTE frequency band 12 configuration, the TX filter 26 is configured as a ladder filter with series resonators TX1, TX2, TX3, TX4, TX5 and shunt resonators TX6, TX7, TX8. The RX filter 28 includes series resonator RX1 and a CRF1 SAW device and a CRF2 SAW device between the ANT port and the RX port. In particular, the CRF1 and CRF2 SAW devices may be arranged in a cascading configuration between the resonator RX1 and the RX port. As illustrated in FIG. 5A, a phasing element 59 may be connected between the ANT port and ground. As illustrated in FIG. 5A, the compensation structure 58 is configured with connections between the TX port and the ANT port and is thereby arranged in parallel with the signal lines connecting the TX port and the ANT port. In this regard, the compensation structure 58 may be configured to adjust or filter the phase and magnitude of a leakage signal between the TX port and the ANT port, thereby providing improved isolation for the TX filter 26 of the RF duplexer 56. In particular, the compensation structure 58 may adjust the amplitude and phase of the leakage signal through the compensation structure 58 in order to reduce or cancel out the leakage signal between the TX port and the ANT port. As with previous embodiments, the compensation structure 58 may comprise a SAW CRF structure that includes the plurality of IDTs 36-1 to 36-4 that are longitudinally coupled between the two reflective structures 38-1, 38-2. Each of the plurality of IDTs 36-1 to 36-4 comprises an electrode pair that includes the corresponding first electrode 40-1 to 40-4 and the corresponding second electrode 42-1 to 42-4. As illustrated, the first electrode 40-1 of the first IDT 36-1 is electrically connected between the series resonators TX4 and TX5, and the second electrode 42-1 of the first IDT 36-1 is electrically connected to ground. Additionally, the second electrode 42-4 of the last IDT 36-4 is electrically connected between the series resonator TX1 and the ANT port, and the first electrode 40-4 of the last IDT 36-4 is electrically connected to ground. In this regard, the compensation structure 58 is electrically connected in parallel with portions of the TX filter 26 between the TX port and the ANT port. The additional IDTs 36-2 and 36-3 are longitudinally coupled between the IDT 36-1 and the IDT 36-4. The second electrode 42-2 of the additional IDT 36-2 is electrically connected to ground, and the first electrode 40-2 of the additional IDT 36-2 is an electrically floating electrode. Notably, the second electrode 42-3 of the other additional IDT 36-3 is electrically connected to a different portion of the TX filter 26, e.g. between the series resonators TX1 and TX2, and the first electrode 40-3 of the other additional IDT 36-3 is an electrically floating electrode. Additionally, the first electrodes 40-2, 40-3 that are electrically floating may be connected to one another. In this regard, the SAW CRF of the compensation structure 58 is electrically connected to three different portions of the signal line of the TX filter 26. Accordingly, different portions of the leakage signal in the TX filter 26 are configured to interact and have phase differences with one another in the SAW CRF of the compensation structure 58 for isolation improvement. In particular, one or more of the plurality of IDTs 36-1 to 36-4 of the compensation structure 58 may be differently tuned or configured to provide overall cancelling of the leakage signal.

Figure 5B:
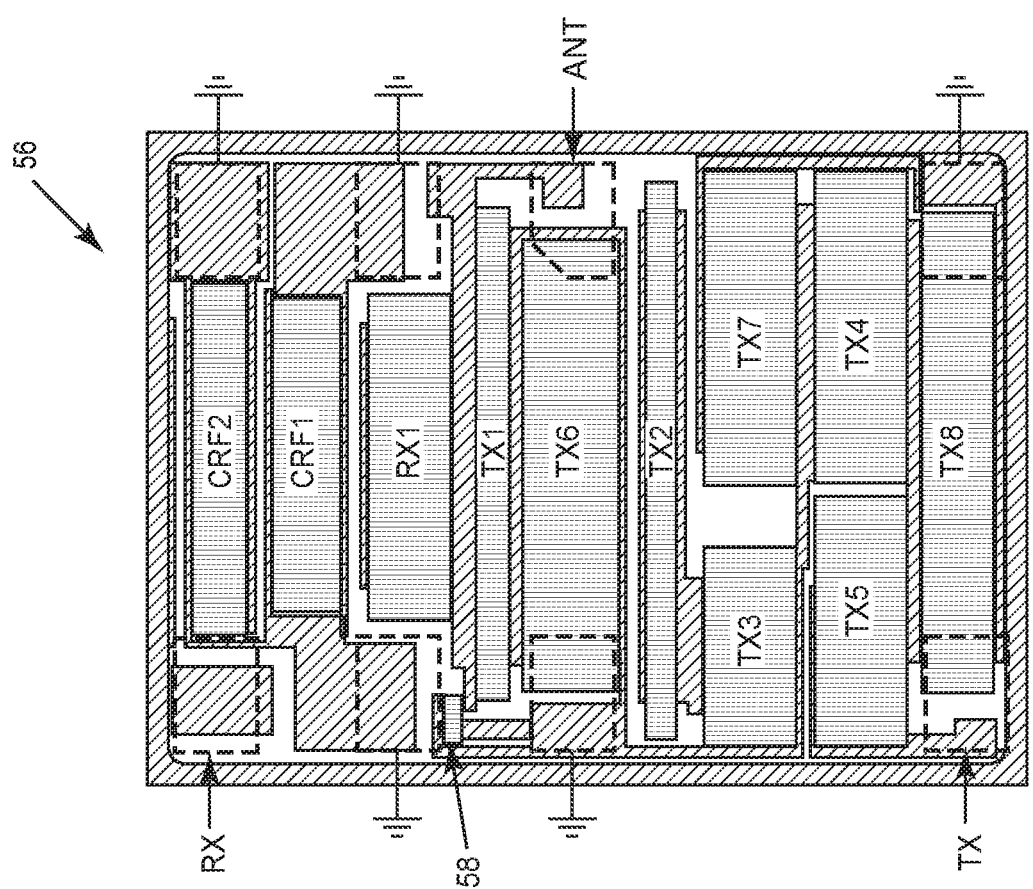
FIG. 5B is a top view of a device layout of the RF duplexer of FIG. 5A.

FIG. 5B is a top view of a device layout of the RF duplexer 56 of FIG. 5A. As illustrated, the resonators TX1 to TX8, the resonator RX1, the CRF1 SAW, and the CRF2 SAW devices are arranged sequentially across the RF duplexer 56 with areas for RX, TX, antenna, and various ground connections. In FIG. 5B, the compensation structure 58 occupies a relatively small area adjacent to the resonator TX1. In this regard, the compensation structure 58 may be incorporated within the same chip as the rest of the RF duplexer 56, thereby providing improved isolation without having a substantial impact on the overall size of the RF duplexer 56.

Figure 5C:
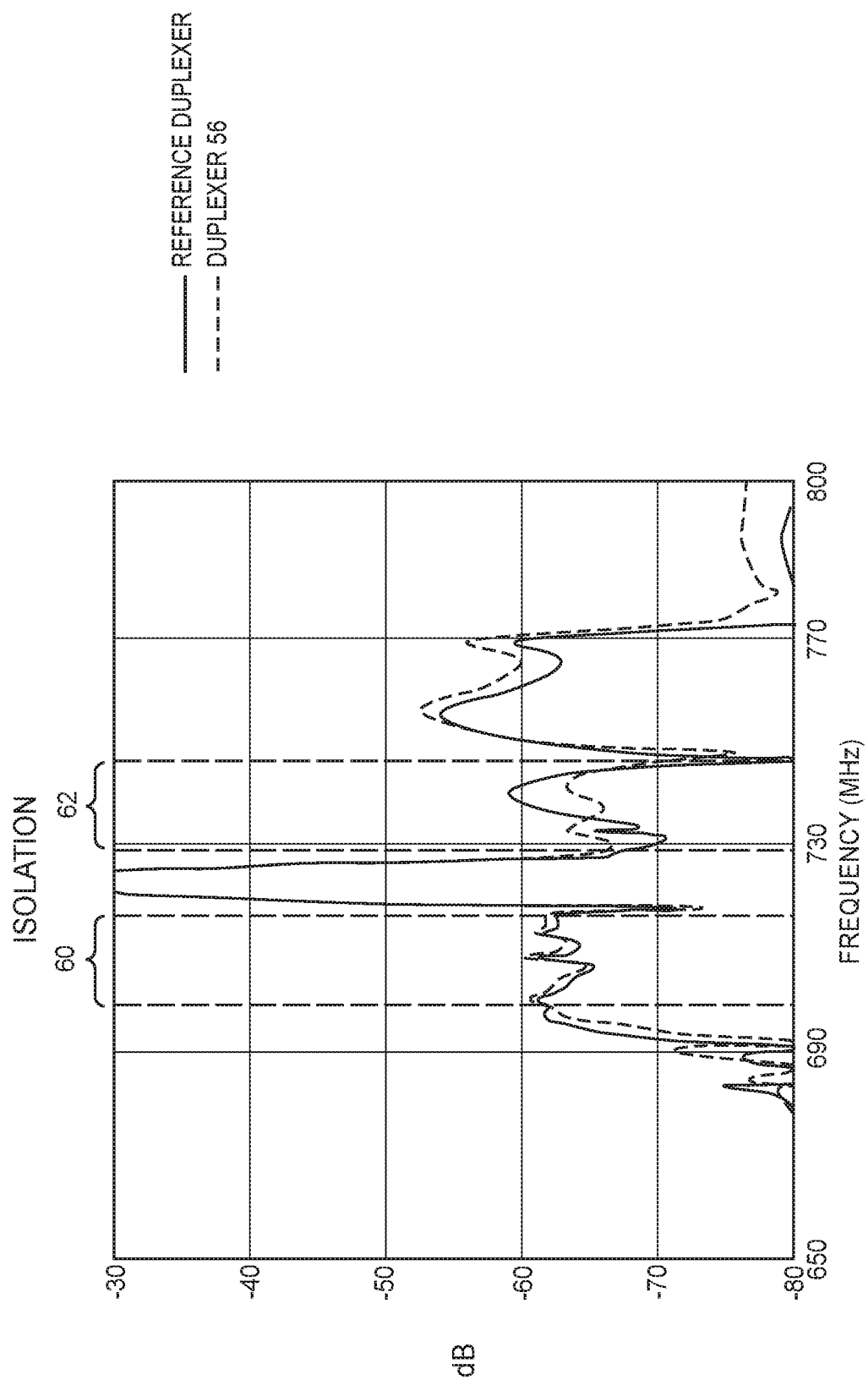
FIG. 5C is a comparison plot for isolation performance simulations of the RF duplexer of FIG. 5A according to embodiments disclosed herein.

FIG. 5C is a comparison plot for isolation performance simulations of the RF duplexer 56 of FIG. 5A according to embodiments disclosed herein. For comparison purposes, simulations were performed comparing the RF duplexer 56 to a "Reference Duplexer" that is configured the same as the RF duplexer 56 but without the compensation structure (58 of FIG. 5A). The isolation performance is plotted in dB across a MHz frequency range and a lower value indicates better isolation. In FIG. 5C, the isolation performance is plotted over a wide frequency range to show the isolation in both the TX frequency range or band 60 and the RX frequency range or band 62. In particular, the simulation results show the RF duplexer 56 has an isolation improvement of about 5 dB at a frequency of 740 MHz while showing similar results at other frequency ranges.

Figure 6A:
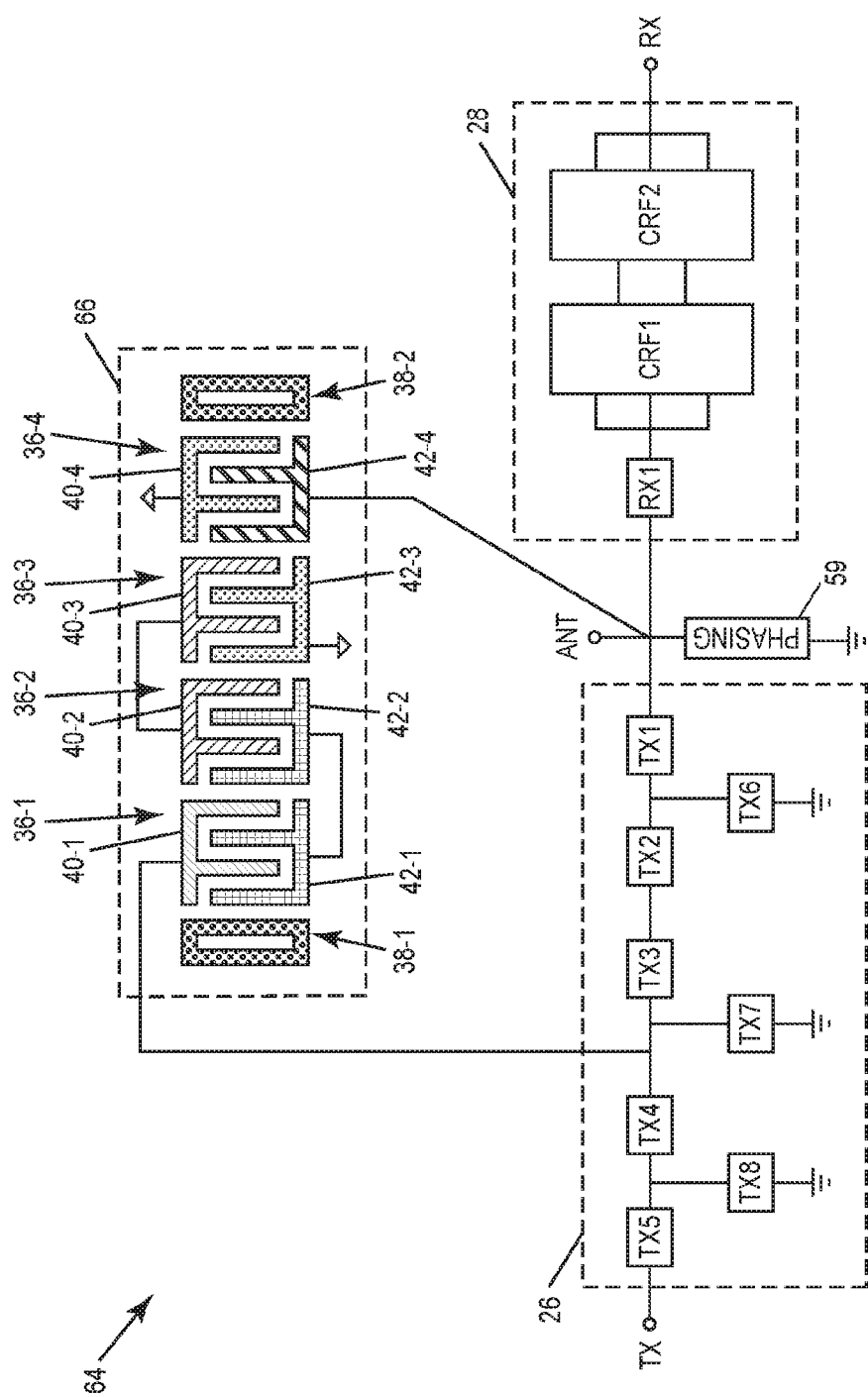
FIG. 6A is block diagram of a different RF duplexer that includes a compensation structure for improving isolation between the TX filter and the RX filter according to embodiments disclosed herein.

FIG. 6A is block diagram of another RF duplexer 64 configured for the LTE frequency band 12 that includes a compensation structure 66 for improving isolation between the TX filter 26 and the RX filter 28 according to embodiments disclosed herein. As previously described, the TX filter 26 is configured as a ladder filter with series resonators TX1, TX2, TX3, TX4, TX5 and shunt resonators TX6, TX7, TX8. The RX filter 28 includes series resonator RX1 and a CRF1 SAW device and a CRF2 SAW device between the ANT port and the RX port. In particular, the CRF1 and CRF2 SAW devices may be arranged in a cascading configuration between the resonator RX1 and the RX port. As illustrated in FIG. 6A, a phasing element 59 may be connected between the ANT port and ground. As illustrated in FIG. 6A, the compensation structure 66 is configured with connections between the TX port and the ANT port and is thereby arranged in parallel with the signal lines connecting the TX port and the ANT port. In this regard, the compensation structure 66 may be configured to adjust or filter the phase and magnitude of a leakage signal between the TX port and the ANT port, thereby providing improved isolation for the TX filter 26 of the RF duplexer 64. In particular, the compensation structure 66 may adjust the amplitude and phase of the leakage signal through the compensation structure 66 in order to reduce or cancel out the leakage signal between the TX port and the ANT port. As with previous embodiments, the compensation structure 66 may comprise a SAW CRF structure that includes the plurality of IDTs 36-1 to 36-4 that are longitudinally coupled between the two reflective structures 38-1, 38-2. Each of the plurality of IDTs 36-1 to 36-4 comprises an electrode pair that includes the corresponding first electrode 40-1 to 40-4 and the corresponding second electrode 42-1 to 42-4. As illustrated, the first electrode 40-1 of the first IDT 36-1 is electrically connected between adjacent series resonators TX3 and TX4, and the second electrode 42-1 of the first IDT 36-1 comprises an electrically floating electrode. Additionally, the second electrode 42-4 of the last IDT 36-4 is electrically connected between the series resonator TX1 and the ANT port, and the first electrode 40-4 of the last IDT 36-4 is electrically connected to ground. In this regard, the compensation structure 66 is electrically connected in parallel with the series resonators TX1, TX2, and TX3 between the TX port and the ANT port. The additional IDTs 36-2 and 36-3 are longitudinally coupled between the IDT 36-1 and the IDT 36-4. Notably, the first electrode 40-2 and the second electrode 42-2 of the additional IDT 36-2 both comprise electrically floating electrodes. The first electrode 40-3 of the other additional IDT 36-3 is also an electrically floating electrode while the second electrode 42-3 of the other additional IDT 36-3 is electrically connected to ground. Additionally, the first electrodes 40-2, 40-3 that are electrically floating may be connected to one another and the second electrodes 42-1, 42-2 that are electrically floating may be connected to one another. In certain embodiments, an increased number of floating electrodes, e.g. 40-2, 40-3, 42-1, 42-2, may be advantageous where layout spacing may not otherwise allow more of the electrodes 40-2, 40-3, 42-1, 42-2 to be electrically connected to ground.

Figure 6B:
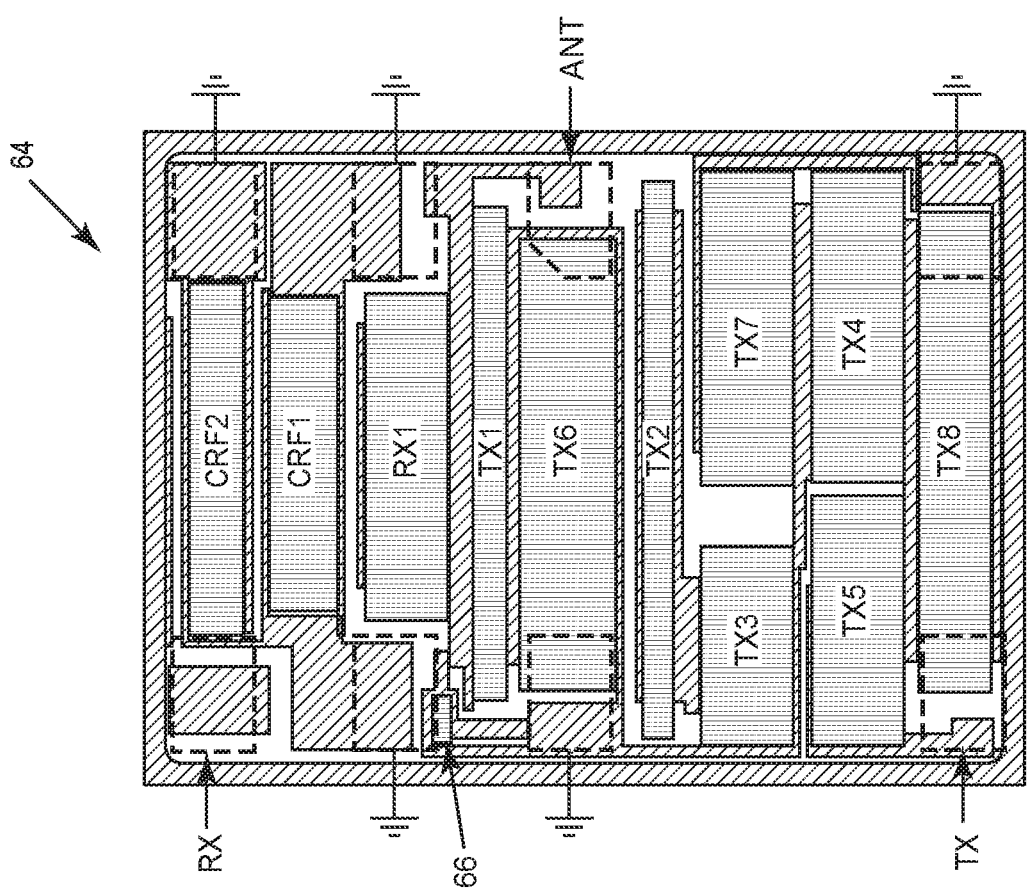
FIG. 6B is a top view of a device layout of the RF duplexer of FIG. 6A.

FIG. 6B is a top view of a device layout of the RF duplexer 64 of FIG. 6A. As illustrated, the resonators TX1 to TX8, the resonator RX1, the CRF1 SAW, and the CRF2 SAW devices are arranged sequentially across the RF duplexer 64 with areas for RX, TX, antenna, and various ground connections. In FIG. 6B, the compensation structure 66 occupies a relatively small area adjacent to the resonator TX1. As previously described, the compensation structure 66 may be incorporated within the same chip as the rest of the RF duplexer 64, thereby providing improved isolation without having a substantial impact on the size of the RF duplexer 64.

Figure 6C:
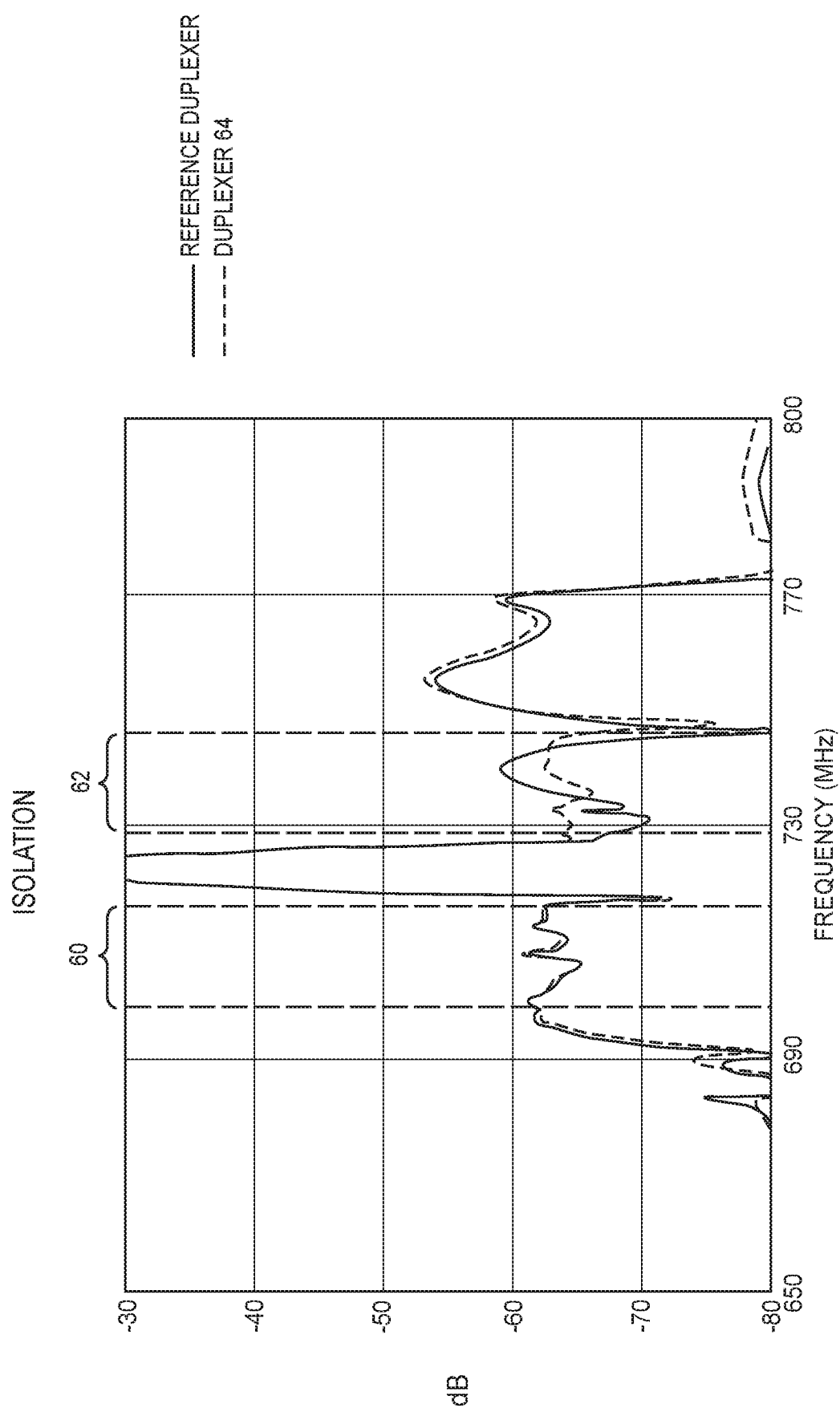
FIG. 6C is a comparison plot for isolation performance simulations of the RF duplexer of FIG. 6A according to embodiments disclosed herein.

FIG. 6C is a comparison plot for isolation performance simulations of the RF duplexer 64 of FIG. 6A according to embodiments disclosed herein. For comparison purposes, simulations were performed comparing the RF duplexer 64 to the same "Reference Duplexer" described for FIG. 5C. In this manner, the Reference Duplexer is also configured the same as the RF duplexer 64 but without the compensation structure (66 of FIG. 6A). The isolation performance is plotted in dB across a MHz frequency range and a lower value indicates better isolation. In FIG. 6C, the isolation performance is plotted over a wide frequency range to show the isolation in both the TX frequency range 60 and the RX frequency range 62. In particular, the simulation results show the RF duplexer 64 has an isolation improvement of about 4 dB at a frequency of 740 MHz while showing similar results at other frequency ranges.

Figure 7A:
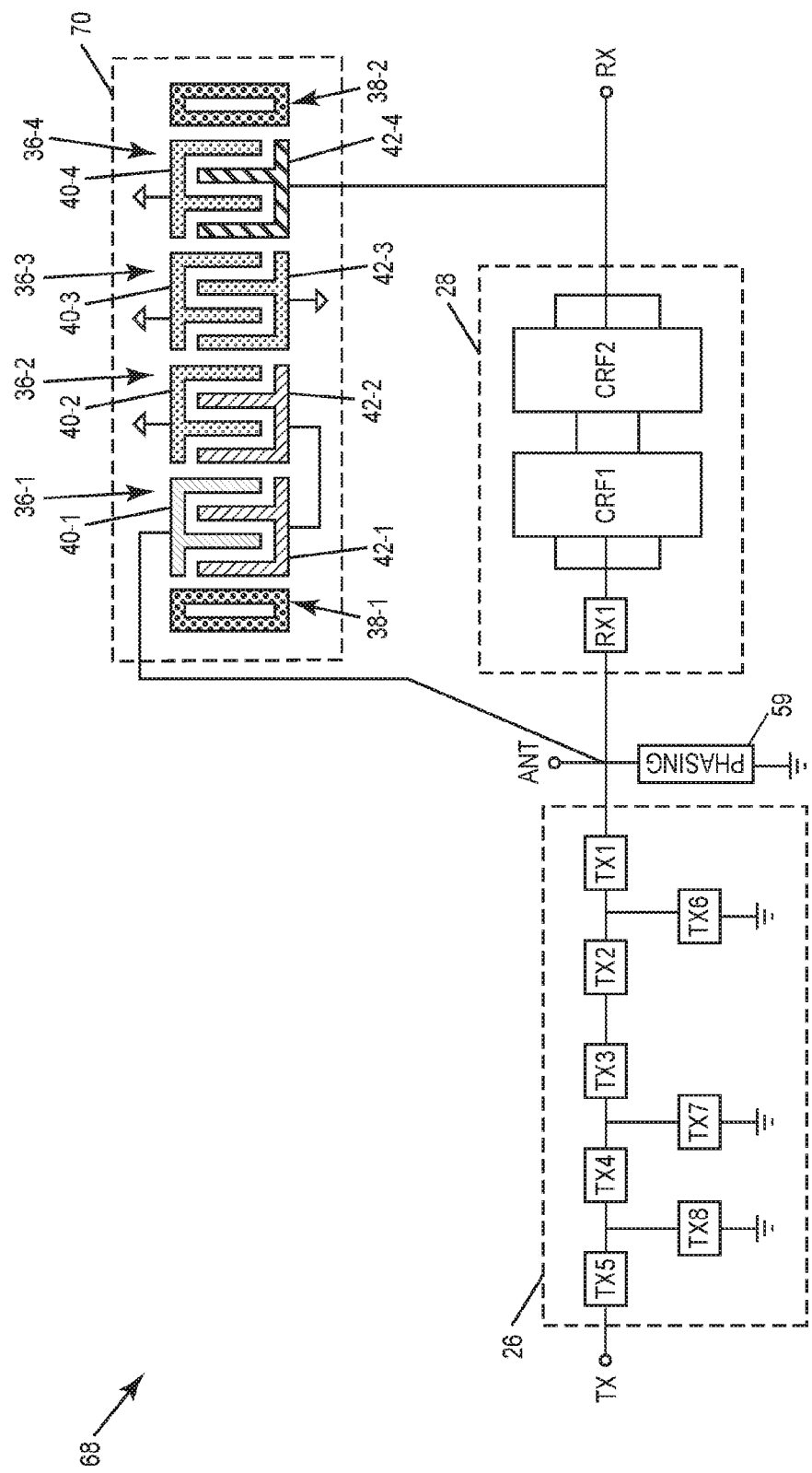
FIG. 7A is block diagram of a different RF duplexer that includes a compensation structure for improving isolation between the TX filter and the RX filter according to embodiments disclosed herein.

FIG. 7A is block diagram of another RF duplexer 68 configured for the LTE frequency band 12 that includes a compensation structure 70 for improving isolation between the TX filter 26 and the RX filter 28 according to embodiments disclosed herein. As previously described, the TX filter 26 is configured as a ladder filter with series resonators TX1, TX2, TX3, TX4, TX5 and shunt resonators TX6, TX7, TX8. The RX filter 28 includes series resonator RX1 and a CRF1 SAW device and a CRF2 SAW device between the ANT port and the RX port. In particular, the CRF1 and CRF2 SAW devices may be arranged in a cascading configuration between the resonator RX1 and the RX port. As illustrated in FIG. 7A, a phasing element 59 may be connected between the ANT port and ground. As illustrated in FIG. 7A, the compensation structure 70 is configured with connections between the RX port and the ANT port and is thereby arranged in parallel with the signal lines connecting the RX port and the ANT port. In this regard, the compensation structure 70 may be configured to adjust or filter the phase and magnitude of a leakage signal between the RX port and the ANT port, thereby providing improved isolation for the RX filter 28 of the RF duplexer 68. In particular, the compensation structure 70 may adjust the amplitude and phase of the leakage signal through the compensation structure 70 in order to reduce or cancel out the leakage signal between the RX port and the ANT port. As with previous embodiments, the compensation structure 70 may comprise a SAW CRF structure that includes the plurality of IDTs 36-1 to 36-4 that are longitudinally coupled between the two reflective structures 38-1, 38-2. Each of the plurality of IDTs 36-1 to 36-4 comprises an electrode pair that includes the corresponding first electrode 40-1 to 40-4 and the corresponding second electrode 42-1 to 42-4. As illustrated, the first electrode 40-1 of the first IDT 36-1 is electrically connected between the series resonator RX1 and the ANT port, and the second electrode 42-1 of the first IDT 36-1 comprises an electrically floating electrode. Additionally, the second electrode 42-4 of the last IDT 36-4 is electrically connected between the CRF2 SAW device and the RX port, and the first electrode 40-4 of the last IDT 36-4 is electrically connected to ground. In this regard, the compensation structure 70 is electrically connected in parallel with the RX filter 28. The additional IDTs 36-2 and 36-3 are longitudinally coupled between the IDT 36-1 and the IDT 36-4. The first electrode 40-2 of the additional IDT 36-2 is electrically connected to ground, and the second electrode 42-2 of the additional IDT 36-2 comprises an electrically floating electrode. The first electrode 40-3 and the second electrode 42-3 of the other additional IDT 36-3 are both electrically connected to ground. Additionally, the second electrodes 42-1, 42-2 that are electrically floating may be connected to one another. In operation, acoustic waves coupled between the first and last IDTs 36-1, 36-4 may be further altered or adjusted by the additional IDTs 36-2, 36-3, thereby providing improved isolation in the RX filter 28.

Figure 7B:
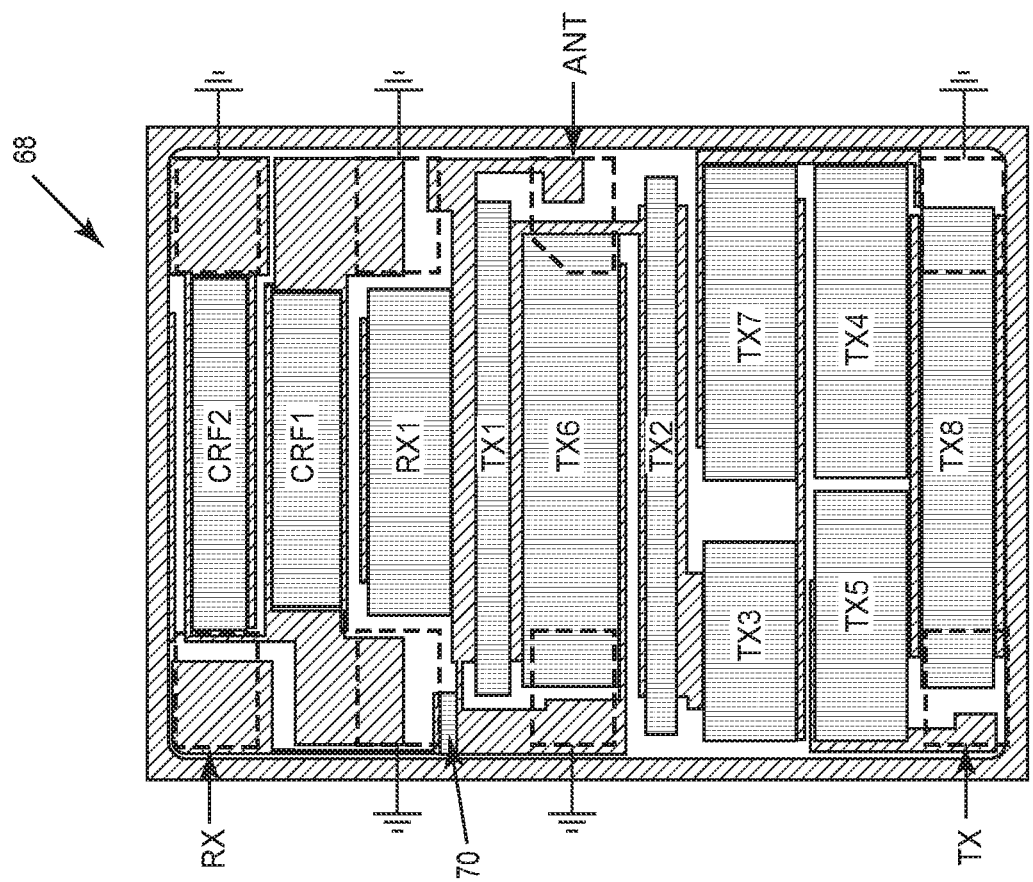
FIG. 7B is a top view of a device layout of the RF duplexer of FIG. 7A.

FIG. 7B is a top view of a device layout of the RF duplexer 68 of FIG. 7A. As illustrated, the resonators TX1 to TX8, the resonator RX1, the CRF1 SAW, and the CRF2 SAW devices are arranged sequentially across the RF duplexer 68 with areas for RX, TX, antenna, and various ground connections. In FIG. 7B, the compensation structure 70 occupies a relatively small area adjacent to the resonator TX1. As previously described, the compensation structure 70 may be incorporated within the same chip as the rest of the RF duplexer 68, thereby providing improved isolation without having a substantial impact on the overall size of the RF duplexer 68.

Figure 7C:
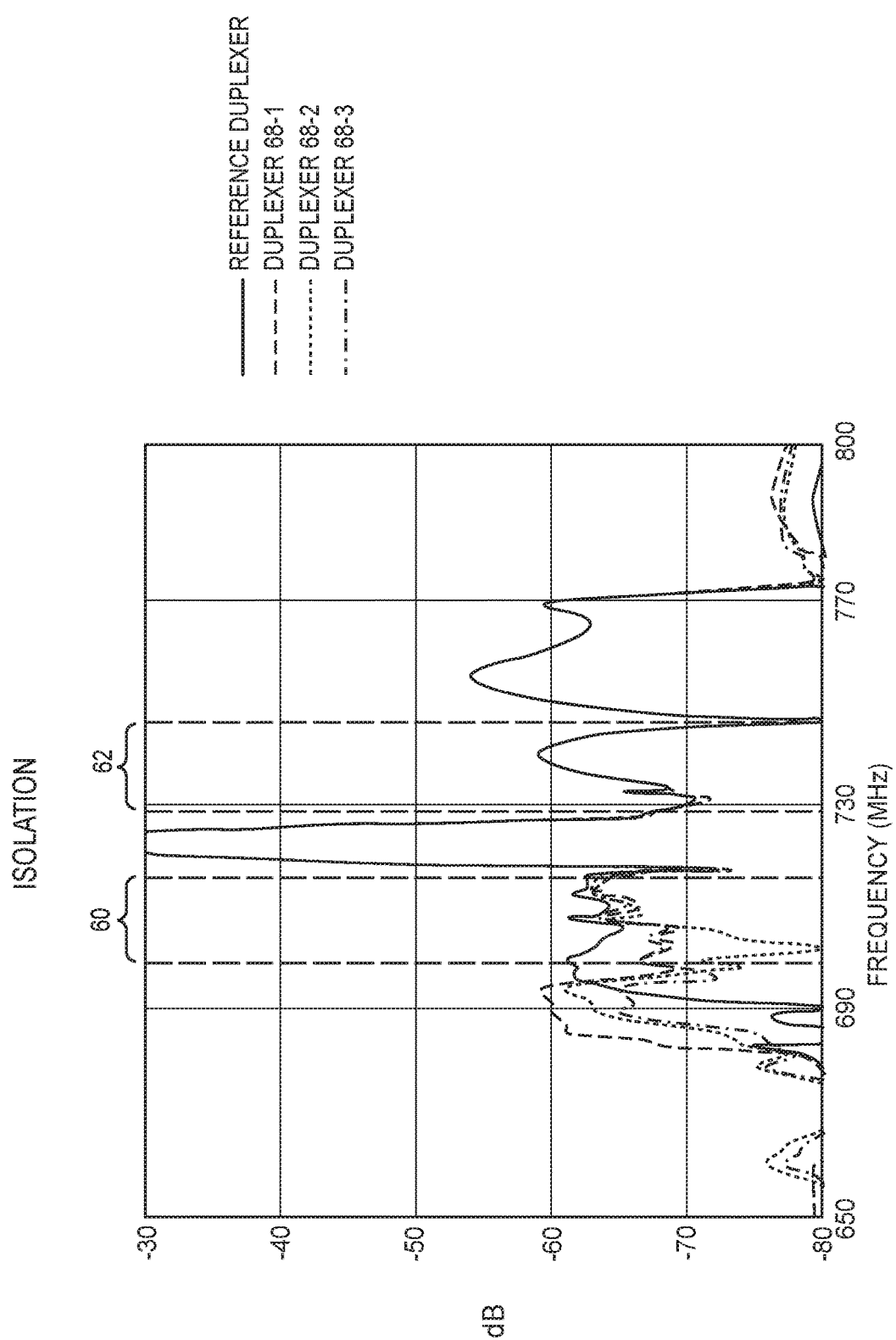
FIG. 7C is a comparison plot for isolation performance simulations of the RF duplexer of FIG. 7A according to embodiments disclosed herein.

FIG. 7C is a comparison plot for isolation performance simulations of the RF duplexer 68 of FIG. 7A according to embodiments disclosed herein. For comparison purposes, simulations were performed comparing the RF duplexer 68 to the same "Reference Duplexer" described for FIG. 5C. In this manner, the Reference Duplexer is also configured the same as the RF duplexer 68 but without the compensation structure (70 of FIG. 7A). The isolation performance is plotted in dB across a MHz frequency range and a lower value indicates better isolation. In FIG. 7C, the isolation performance is plotted over a wide frequency range to show the isolation in both the TX frequency range 60 and the RX frequency range 62. Three different RF duplexer configurations 68-1, 68-2, 68-3 of the RF duplexer 68 are simulated. For the first configuration 68-1, the following dimensions were simulated: aperture=10λ, aperture frequency=1200 MHz, length=2λ and frequency=847 MHz for both reflective structures (38-1, 38-2 of FIG. 7A), length=5λ and frequency=740 MHz for the first and last IDTs (36-1, 36-4 of FIG. 7A) and the additional IDT (36-2 of FIG. 7A), and length=2λ and frequency=857 MHz for the other additional IDT (36-3 of FIG. 7A). For the second configuration 68-2, the following dimensions were simulated: aperture=12λ, aperture frequency=1200 MHz, length=2λ and frequency=805 MHz for both reflective structures (38-1, 38-2 of FIG. 7A), length=5λ and frequency=760 MHz for the first and last IDTs (36-1, 36-4 of FIG. 7A) and the additional IDT (36-2 of FIG. 7A), and length=2λ and frequency=805 MHz for the other additional IDT (36-3 of FIG. 7A). For the third configuration 68-3, the following dimensions were simulated: aperture=10λ, aperture frequency=1200 MHz, length=2λ and frequency=805 MHz for both reflective structures (38-1, 38-2 of FIG. 7A), length=5λ and frequency=760 MHz for the first and last IDTs (36-1, 36-4 of FIG. 7A) and the additional IDT (36-2 of FIG. 7A), and length=2λ and frequency=805 MHz for the other additional IDT (36-3 of FIG. 7A). The simulation results show that when configuring the compensation structure (70 of FIG. 7A) in parallel with the RX filter 28, isolation is improved in the TX frequency band 60 with a similar isolation in the RX frequency band 62. For example, at a frequency of about 699 MHz, the RF duplexer configurations 68-1, 68-2, and 68-3 show between about 5 dB to about 10 dB isolation improvement.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) filtering device, comprising:
   a plurality of series resonators and a plurality of shunt resonators electrically connected along a signal line between a first port and a second port; and
   a compensation structure arranged in parallel with one or more series resonators of the plurality of series resonators, the compensation structure comprising:
   a surface acoustic wave (SAW) device comprising:
   a piezoelectric material; and
   a plurality of interdigital transducers (IDTs) on the piezoelectric material that are longitudinally coupled between two reflective structures, wherein a first IDT and a last IDT of the plurality of IDTs are electrically connected to different portions of the signal line, the first IDT comprising a first electrode that is electrically connected to the signal line and a second electrode that comprises an electrically floating electrode, and at least one additional IDT of the plurality of IDTs is arranged between the first IDT and the last IDT, the at least one additional IDT comprising an electrically floating electrode.

2. The RF filtering device of claim 1, wherein the at least one additional IDT further comprises an electrode that is electrically connected to ground.

3. The RF filtering device of claim 1, wherein the first port comprises a transmitter (TX) port, the second port comprises a receiver (RX) port, and the RF filtering device further comprises an antenna (ANT) port.

4. The RF filtering device of claim 3, wherein the plurality of series resonators comprises a plurality of TX series resonators arranged between the TX port and the ANT port and a plurality of RX series resonators arranged between the RX port and the ANT port.

5. A radio frequency (RF) duplexing device, comprising:
   a transmitter (TX) port;
   a receiver (RX) port;
   an antenna (ANT) port;
   a TX filter connected between the TX port and the ANT port;
   an RX filter connected between the RX port and the ANT port; and
   a compensation structure electrically connected to a signal line between the RX port and the TX port, the compensation structure comprising:
   a piezoelectric material; and
   a plurality of interdigital transducers (IDTs) on the piezoelectric material that are longitudinally coupled between two reflective structures to form a surface acoustic wave (SAW) device, the plurality of IDTs comprising a first IDT, a last IDT, and at least one additional IDT that is arranged between the first IDT and the last IDT, the at least one additional IDT comprising an electrically floating electrode, and wherein each of the first IDT, the at least one additional IDT, and the last IDT are electrically connected to a different portion of the signal line.

6. The RF duplexing device of claim 5, wherein the TX filter comprises a plurality of TX series resonators and the first IDT is electrically connected to the signal line between the plurality of TX series resonators and the TX port.

7. The RF duplexing device of claim 6, wherein the last IDT is electrically connected between the plurality of TX series resonators and the ANT port.

8. The RF duplexing device of claim 5, wherein the TX filter comprises a plurality of TX series resonators and the first IDT is electrically connected between two adjacent TX series resonators of the plurality of TX series resonators.

9. The RF duplexing device of claim 8, wherein the last IDT is electrically connected between the plurality of TX series resonators and the ANT port.

10. The RF duplexing device of claim 5, wherein the first IDT comprises a first electrode that is electrically connected to the signal line and a second electrode that comprises an electrically floating electrode.

11. A radio frequency (RF) filtering device, comprising:
    a plurality of series resonators and a plurality of shunt resonators electrically connected along a signal line between a first port and a second port;
    a compensation structure arranged in parallel with one or more series resonators of the plurality of series resonators, the compensation structure comprising:
    a surface acoustic wave (SAW) device comprising:
    a piezoelectric material; and
    a plurality of interdigital transducers (IDTs) on the piezoelectric material that are longitudinally coupled between two reflective structures, wherein a first IDT and a last IDT of the plurality of IDTs are electrically connected to different portions of the signal line, and at least one additional IDT of the plurality of IDTs is arranged between the first IDT and the last IDT, the at least one additional IDT comprising an electrically floating electrode; and a SAW filtering device serially connected between the second port and the plurality of series resonators, wherein the last IDT is electrically connected between the SAW filtering device and the plurality of series resonators.

12. The RF filtering device of claim 11, wherein the first port comprises a transmitter (TX) port, the second port comprises a receiver (RX) port, and the RF filtering device further comprises an antenna (ANT) port.

13. The RF filtering device of claim 12, wherein the plurality of series resonators comprises a plurality of TX series resonators arranged between the TX port and the ANT port and a plurality of RX series resonators arranged between the RX port and the ANT port.

14. The RF filtering device of claim 13, wherein the first IDT is electrically connected between the TX port and the plurality of TX series resonators and the last IDT is electrically connected between the RX port and the plurality of RX series resonators.

15. The RF filtering device of claim 13, wherein the last IDT is electrically connected between the plurality of RX series resonators and the RX port.

16. The RF filtering device of claim 13, wherein the first IDT is electrically connected between the RX filter and the ANT port and the last IDT is electrically connected between the RX filter and the RX port.

17. The RF filtering device of claim 13, wherein the last IDT is electrically connected between the SAW filtering device and the plurality of RX series resonators.

18. The RF filtering device of claim 11, wherein the at least one additional IDT comprises two additional IDTs and each of the two additional IDTs comprises an electrically floating electrode and an electrode that is electrically connected to ground.

19. The RF filtering device of claim 11, wherein the at least one additional IDT further comprises an electrode that is electrically connected to ground and at least one other additional IDT of the plurality of IDTs comprises an electrode that is electrically connected to the signal line.

20. The RF filtering device of claim 19, wherein the at least one other additional IDT and the first IDT are electrically connected to a same portion of the signal line.

21. The RF filtering device of claim 19, wherein the at least one other additional IDT is electrically connected to a different portion of the signal line than the first IDT.

* * * * *

UNITED STATES PATENT AND TRADEMARK OFFICE
CERTIFICATE OF CORRECTION

PATENT NO. : 10,873,319 B2  
APPLICATION NO. : 16/272139  
DATED : December 22, 2020  
INVENTOR(S) : Manjunath Swamy Page 1 of 1

It is certified that error appears in the above-identified patent and that said Letters Patent is hereby corrected as shown below:

In the Specification

At Column 6, Lines 12, 16, and 18, replace "wavelength A" with --wavelength $\lambda$--.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*